United States Patent [19]

Ihara et al.

[11] Patent Number: 5,576,987

[45] Date of Patent: Nov. 19, 1996

[54] SEMICONDUCTOR MEMORY DEVICE

[75] Inventors: Makoto Ihara, Sakurai; Toshio Mimoto, Nara, both of Japan

[73] Assignee: Sharp Kabushiki Kaisha, Osaka, Japan

[21] Appl. No.: 315,583

[22] Filed: Sep. 30, 1994

Related U.S. Application Data

[62] Division of Ser. No. 3,991, Jan. 15, 1993, Pat. No. 5,406,516.

[30] Foreign Application Priority Data

| Jan. 17, 1992 | [JP] | Japan | 4-6808 |
| Mar. 31, 1992 | [JP] | Japan | 4-77713 |
| Jun. 17, 1992 | [JP] | Japan | 4-158323 |

[51] Int. Cl.$^6$ .................................................. G11C 11/24
[52] U.S. Cl. .................................... 365/149; 365/189.01
[58] Field of Search .............................. 365/149, 189.01, 365/230.01, 210; 380/4

[56] References Cited

U.S. PATENT DOCUMENTS

| 4,327,410 | 4/1982 | Patel et al. | 365/228 |
| 4,744,062 | 5/1988 | Nakamura et al. | 365/228 |
| 4,897,819 | 1/1990 | Takizawa | 365/189.01 |
| 4,943,949 | 7/1990 | Yamaguchi et al. | 365/149 X |
| 4,947,377 | 8/1990 | Hannai | 365/149 X |
| 5,031,153 | 7/1991 | Suyama | 365/210 |
| 5,119,336 | 6/1992 | Itoh | 365/195 |
| 5,267,218 | 11/1993 | Elbert | 365/189.01 |
| 5,406,516 | 4/1995 | Ihara et al. | 365/189.01 |

FOREIGN PATENT DOCUMENTS

| 61-271687 | 12/1986 | Japan . |
| 62-202395 | 9/1987 | Japan . |
| 2-2435 | 1/1990 | Japan . |
| 3-129446 | 6/1991 | Japan . |

OTHER PUBLICATIONS

Shubat, A., et al., "Mappable Memory Subsystem for High Speed Applications", *1989 Symposium on VLSI Circuits: Digest of Technical Papers*, 25–27 May 1989, Kyoto, Japan, pp. 47–48.

Primary Examiner—Joseph A. Popek
Attorney, Agent, or Firm—Morrison & Foerster

[57] ABSTRACT

A semiconductor memory device including a write protect information element for storing write permit information or write protect information for a word line or a bit line, and a write protect detection element for outputting a write permit or protect signal to a write circuit in accordance with the information stored in the write protect information element for the word line or bit line selected by a row decoder or a column decoder. When the write circuit receives a write protect signal output from the write protect detection means in the case that the write protect information means stores write protect information, the write circuit does not output a data signal.

22 Claims, 30 Drawing Sheets

FIRST MEMORY CELL

SECOND MEMORY CELL

DUMMY CELL

EXAMPLE OF THE ARRANGEMENT OF MEMORY CELLS
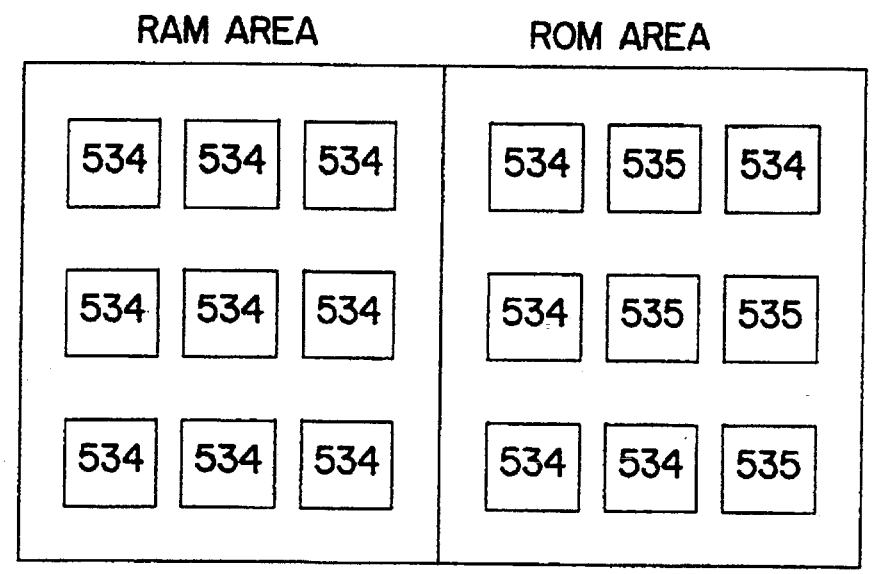
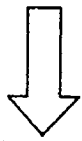
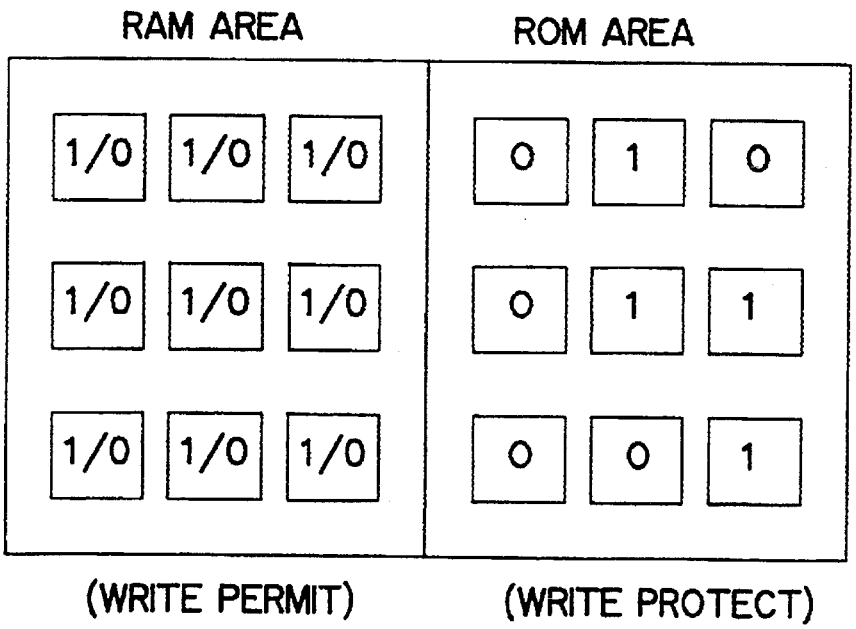
FIG. 30

(a) INSIDE RAS SIGNAL 416
(b) BIT LINE PRECHARGE SIGNAL LINE 415
(c) WORD LINE 430(432)
(d) SECOND DUMMY WORD LINE 429
(e) BIT LINE 447
(f) BIT LINE 448
(g) PMOS SENSE AMPLIFIER DRIVE SIGNAL LINE 414
(h) NMOS SENSE AMPLIFIER DRIVE SIGNAL LINE 413
(i) WE SIGNAL 421
(j) INPUT DATA 419

SEMICONDUCTOR MEMORY DEVICE

This application is a division of application Ser. No. 08/003,991 filed Jan. 15, 1993, now U.S. Pat. No. 5,406,516.

BACKGROUND OF THE INVENTION

1. Field of the Invention

The present invention relates to a semiconductor memory device, and more particularly, relates to a semiconductor memory device having a write protect function in which both ROM areas and RAM areas are mixed on the same chip.

2. Description of the Related Art

Since a nonvolatile read write memory (RWM) retains data written thereon even after it is disconnected from a power supply, part of a memory area thereof can be used as a read only memory (ROM). ROM stores data to be protected from being erased (hereinafter referred to as ROM data). When the non-volatile RWM is used for this purpose, however, it is necessary to ensure that after the ROM data has been stored in the memory area no additional data should be written over the ROM data.

Conventionally, whether writing is permitted or inhibited for a specific memory area has been controlled by an external program through a CPU. In such an external control, in case that the program should have a bug or that a noise should arise during the control, a runaway or a malfunction of the CPU may be caused. As a result, new data may be written over ROM data stored in the memory area of the non-volatile RWM used in place of a ROM and thus the ROM data may be erased.

Japanese Laid-Open Patent Publication No. 3-129446 discloses a computer incorporating an EEPROM (electrically erasable/programmable read-only memory). This computer includes an area designating means (a write area register) for generating a signal designating areas on the EEPROM as write permissible or write protected. The computer also includes a means for comparing the area designated as write permissible by the area designating means with an area designated by data supplied from an address bus, so as to inhibit the data from being written on the area of the EEPROM when the two areas are not identical.

In the above computer, however, it is necessary to supply an address space identification signal which is produced by decoding data from an address decoder to the comparing means. Another address decoder is therefore required in addition to the address decoder for the EEPROM.

Japanese Laid-Open Patent Publication No. 2-2435 discloses a nonvolatile semiconductor memory device which includes a rewrite inhibit circuit for inhibiting rewriting on some memory cells. According to the rewrite inhibit circuit, a high voltage required for rewriting is not applied to such memory cells. The operation of the rewrite inhibit circuit is controlled in accordance with the potential of an input thereto from outside.

In the above semiconductor memory device, however, since the operation of the rewrite inhibit circuit is controlled in accordance with the potential of an input thereto from outside, it is necessary to provide an outer circuit for determining whether writing for a specific address is permissible or not.

Japanese Laid-Open Patent Publication No. 62-202395 discloses a semiconductor integrated circuit device having an input terminal for receiving a write protect signal. The device includes a decoder which does not output a row selective signal for a specific address designation input thereto when the write protect signal is being input from the input terminal.

However, in the above semiconductor integrated circuit device, when writing is inhibited for one of the bit lines selected at a certain cycle, reading from the bit line is not possible, either.

Japanese Laid-Open Patent Publication No. 61-271687 discloses a magnetic bubble cassette having a plurality of memory blocks. The cassette includes a means for generating a write permit signal or a write inhibit signal for each memory block, and a means for detecting the write inhibit signal when a write instruction is supplied. Writing is not performed when the write inhibit signal is detected. The write permit or write inhibit is designated by switching.

In the above magnetic bubble cassette, however, since the write permit or the write inhibit is designated for each memory block, it is not possible to define a smaller area for the write inhibit area.

SUMMARY OF THE INVENTION

The semiconductor memory device of this invention, includes: a row decoder for receiving a row address signal to output a row selective signal in response to the row address signal; a word line connected to the row decoder for receiving the row selective signal; a column decoder for receiving a column address signal to output a column selective signal in response to the column address signal; a switching element connected to the column decoder for receiving the column selective signal to be turned on or off in accordance with the column selective signal; a write circuit for outputting a data signal in accordance with data input from outside; a bit line connected to the write circuit through the switching element for receiving the data signal from the write circuit; a memory cell connected to the word line and the bit line; a write protect information element for storing write permit information or write protect information for the word line; and a write protect detection element connected to the write protect information element and the write circuit, the element outputting a write permit or protect signal to the write circuit in accordance with the information stored in the write protect information element for the word line selected by the row decoder: wherein, when the write circuit receives the write protect signal output from the write protect detection element in the case that the write protect information element stores write protect information, the write circuit does not output the data signal.

Alternatively, the semiconductor memory device of the present invention includes: a row decoder for receiving a row address signal to output a row selective signal in response to the row address signal; a word line connected to the row decoder for receiving the row selective signal; a column decoder for receiving a column address signal to output a column selective signal in response to the column address signal; a switching element connected to the column decoder for receiving the column selective signal to be turned on or off in accordance with the column selective signal; a write circuit for outputting a data signal in accordance with data input from outside; a bit line connected to the write circuit through the switching element for receiving the data signal from the write circuit; and a memory cell connected to the word line and the bit line: wherein the column decoder includes a write protect information element for storing write permit information or write protect information for the bit line and a write protect detection element for changing the output level of the column selective signal in accordance with the information stored in the write protect information element for the bit line selected by the column decoder.

Alternatively, the semiconductor memory device of the present invention has a memory space including a write protect area and a write permit area. The device includes a memory cell array having a plurality of memory cells; a redundant memory for replacing a defect memory cell found in the memory cell array; and a write protect detection element for selectively setting write protect for the redundant memory.

Alternatively, the semiconductor memory device of the present invention has a plurality of bit lines and a plurality of word lines. The device includes: a first memory cell including a first capacitor having a first terminal as a data memory node and a second terminal with a first standard potential, and a first switching transistor having a gate connected to each of the word lines, a source, and a drain, one of the source and the drain being connected to each of the bit lines and the other being connected to the first terminal of the first capacitor; and a second memory cell including a second switching transistor having a gate connected to each of the word lines, and a second capacitor having no substantial electrical connection with the bit lines regardless of the word line being selected or not.

Alternatively, the semiconductor memory device of the present invention has a plurality of bit lines and a plurality of word lines. The device includes: a first memory cell including a first capacitor having a first terminal as a data memory node and a second terminal with a first standard potential, and a first switching transistor having a gate connected to each of the word lines, a source, and a drain, one of the source and drain being connected to each of the bit lines and the other being connected to the first terminal of the first capacitor; and a third memory cell including a third switching transistor and a third capacitor having a comparatively small or substantially zero capacitance.

Thus, the invention described herein makes possible the advantages of (1) providing a semiconductor memory device with high reliability in which it is ensured that ROM data stored in a memory area thereof used as a ROM can be protected from being overwritten mistakenly, (2) providing a semiconductor memory device in which a write protect area as a ROM area can be flexibly defined depending on the amount of ROM data to be stored, (3) providing a semiconductor memory device in which a write protect area is not altered after the remedy of a defect memory cell by a redundant means, (4) providing a semiconductor memory device in which memory cells of DRAM can be used for a ROM to realize a memory chip having both a ROM area and a RAM area, and (5) providing a semiconductor memory device in which a ROM area and a RAM area can be formed on the same bit line.

These and other advantages of the present invention will become apparent to those skilled in the art upon reading and understanding the following detailed description with reference to the accompanying figures.

BRIEF DESCRIPTION OF THE DRAWINGS

FIG. 7b is a schematic plan layout of a memory block constituting the memory chip of FIG. 7a.

FIG. 17b is a plan layout of a memory block constituting the memory chip of FIG. 17a.

FIG. 30 is a schematic view showing one example of the arrangement of memory cells of the semiconductor memory device according to the present invention.

DESCRIPTION OF THE PREFERRED EMBODIMENTS

The present invention will be described by way of examples with reference to the accompanying drawings.

EXAMPLE 1

Figure 7A:
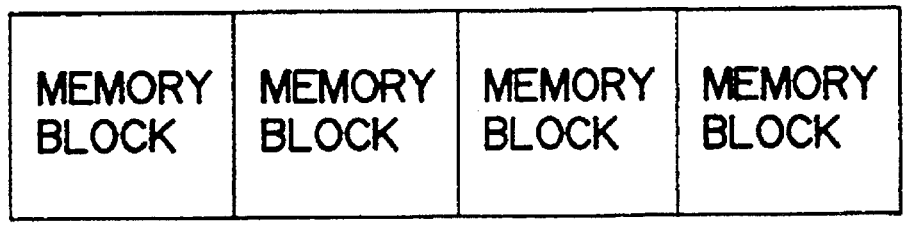
FIG. 7a shows an outlined structure of a memory chip of the first example according to the present invention.
Figure 7B:
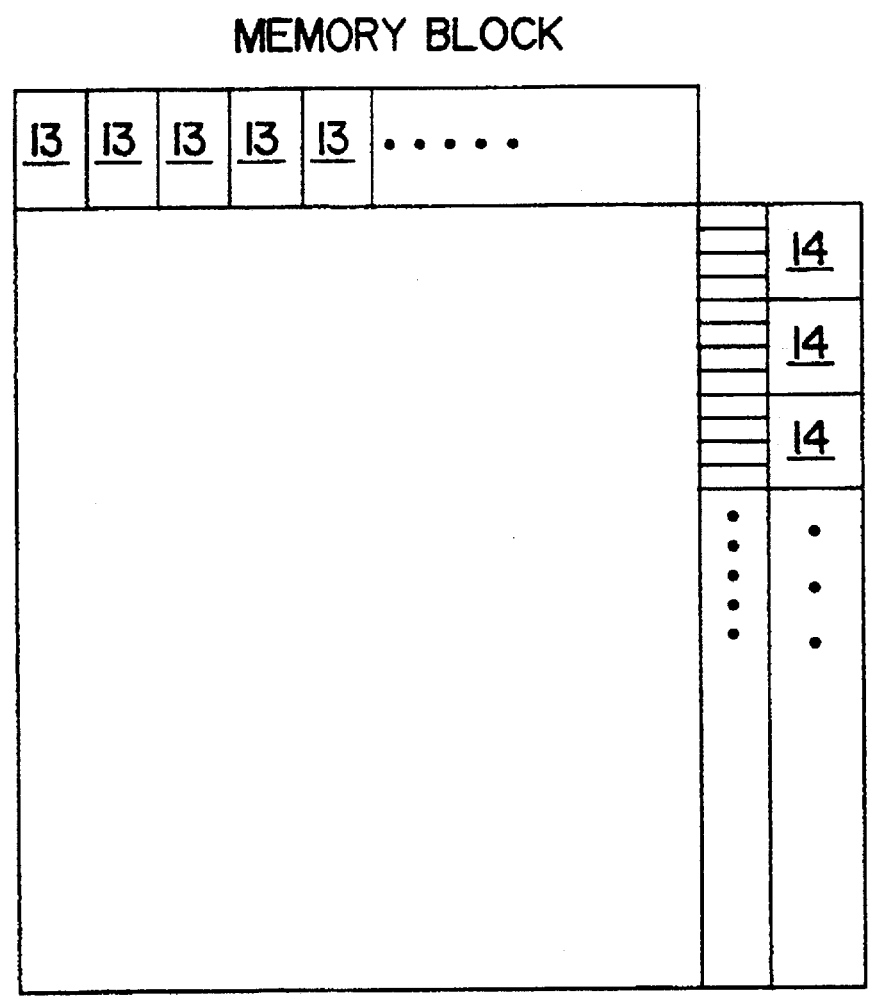

As is shown in FIGS. 7a and 7b, the semiconductor memory device of this example includes a plurality of memory blocks, and each memory block includes a plurality of row decoders 13, a plurality of column decoders 14, and a plurality of write circuits 29. Each write circuit 29 is connected to an I/O buffer (not shown).

Figure 1:
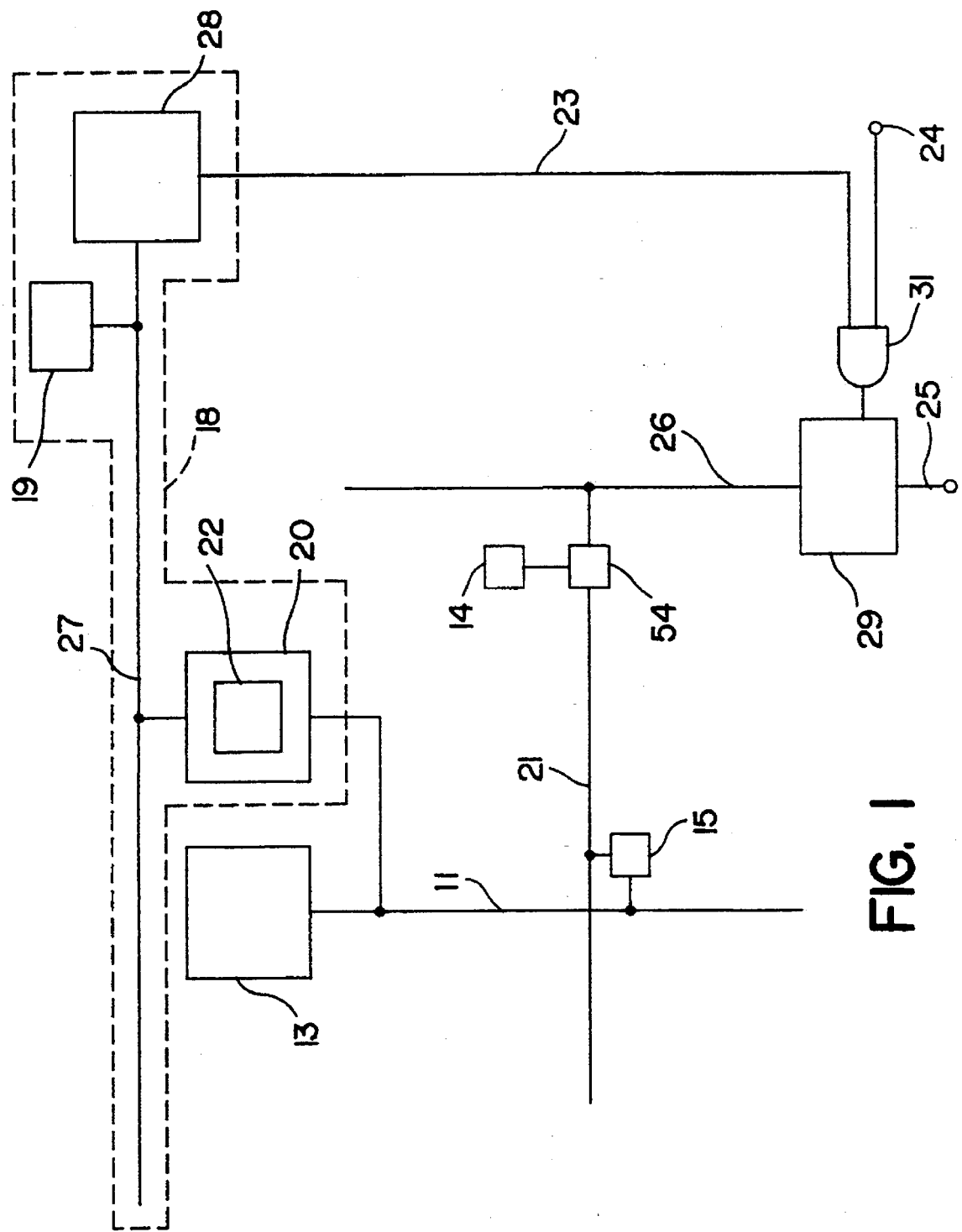
FIG. 1 is a schematic view showing the main portion of the semiconductor memory device of a first example according to the present invention.

FIG. 1 shows a schematic structure of the main portion of the semiconductor memory device of this example. Referring to FIG. 1, the device includes the row decoder 13 which outputs a row selective signal in response to a row address signal, row selective signal lines (word lines) 11 connected to the row decoder 13, the column decoder 14 which outputs a column selective signal in response to a column address signal, and switching elements 54 which open or close in response to the column selective signal. The device also includes the write circuit 29 in which a data signal is output through a common data line (I/O line) 26 in response to data input to a terminal 25 thereof from outside, bit lines 21 connected to the common data line 26 of the write circuit 29 through the switching elements 54, and memory cells 15 connected to the word lines 11 and the bit lines 21. Only one memory cell 15 connected to a specific word line 11 and a specific bit line 21 is shown in FIG. 1 for simplification, but in the actual semiconductor memory device, the memory cells 15 are formed at respective crossings of the word lines 11 and the bit lines 21.

Each of the word lines 11 selectively receives a row selective signal from the row decoder 13, so that the potential of the selected word line 11 changes. Each of the bit lines 21 receives a data signal through the common data line 26 of the write circuit 29 when the switching element 54 is turned on by the column decoder 14. The column decoder 14 and the switching element 54 are herein described as separate components, although these components may be combined and generically called a "column decoder." The bit line 21 is connected to a sensing amplifier (not shown) as in known semiconductor memory devices.

The semiconductor memory device of this example further includes, for each word line 11, a write protect information element 22 which stores write permit information or write protect information and a write protect detection element 18 which is connected to the write protect information element 22 and the write circuit 29.

The write protect detection element 18 outputs a write protect signal to the write circuit 29 through a write protect signal line 23 in accordance with the information stored in the write protect information element 22 for the word line 11 selected by the row decoder 13. The write circuit 29 outputs or stops outputting a data signal to the bit line 21 through the common data line 26 in accordance with the write protect signal.

The write protect information element 22 of this example is an element capable of being either in an ON state or in an OFF state. In this example, the write protect information element 22 is set to the ON state for the word line 11 where writing is inhibited, while it is set to the OFF state for the word line 11 where writing is not inhibited. The write protect detection element 18 outputs a write permit or inhibit signal in accordance with the state of the write protect information element 22.

More specifically, the write protect detection element 18 includes a signal line 27, a potential change element (write protect setting element) 20 connected to the word line 11 and the signal line 27, and a write protect signal output element 28 connected to the signal line 27. The potential change element 20 includes the write protect information element 22. When the word line 11 is selected by the row decoder 13, the potential change element 20 connected to the selected word line 11 changes the potential of the signal line 27 in accordance with the ON or OFF state stored in the write protect information element 22 for the word line 11. The write protect signal output element 28 outputs the write protect signal to the write protect signal line 23 in accordance with the potential of the signal line 27. A biasing or precharging element 19 is connected to the signal line 27 to bias or precharge the signal line 27.

The semiconductor memory device further includes a NAND circuit 31. The input terminals of the NAND circuit 31 are connected to the write protect signal line 23 and a write enable (WE) signal line 24, and the output terminal thereof is connected to the write circuit 29.

Figure 2:
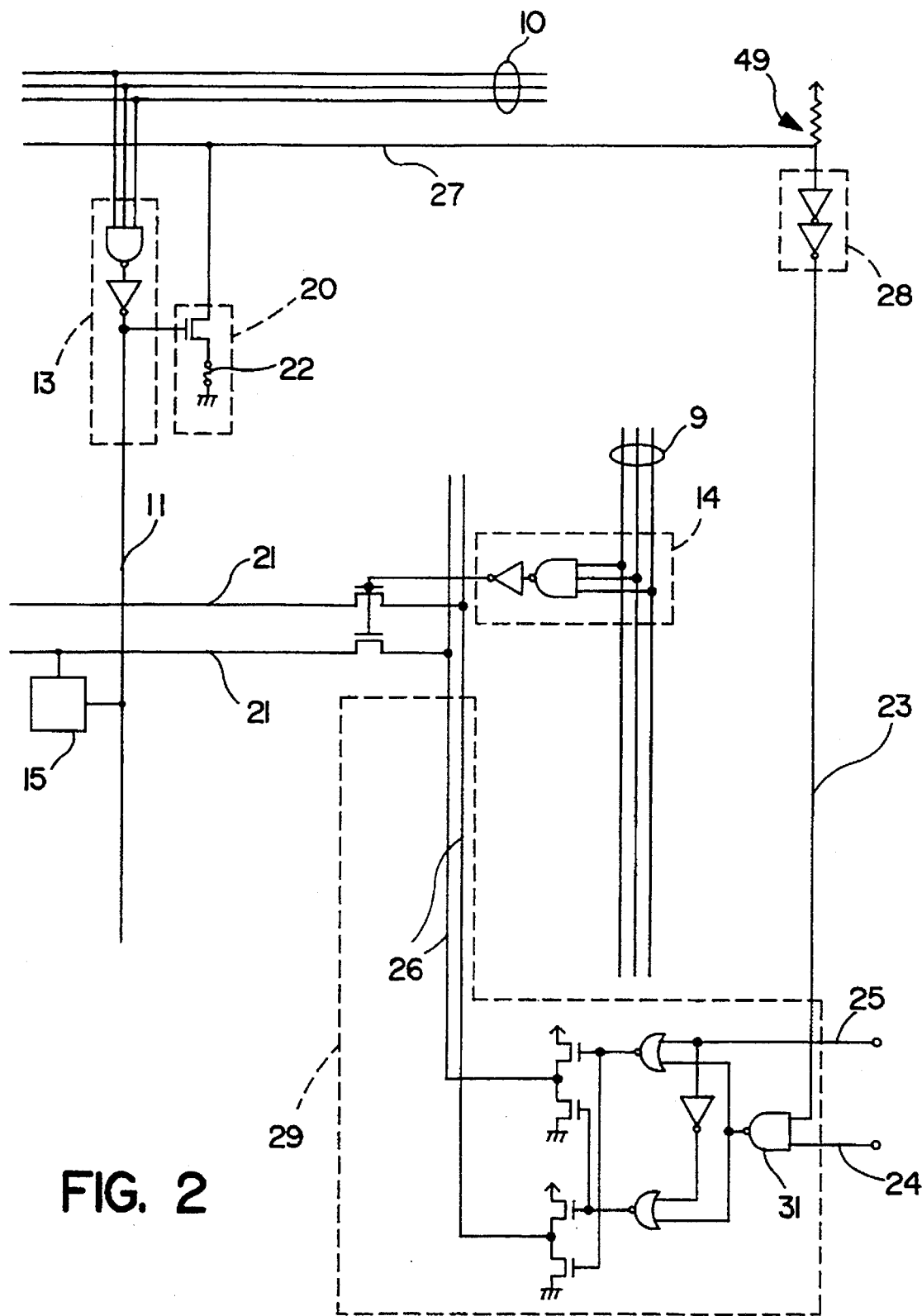
FIG. 2 is a circuit diagram of the semiconductor memory device of FIG. 1 according to the present invention.

Next, referring to FIG. 2, the circuit structure of the semiconductor memory device of this example will be described. The write protect information element 22 of this example is a fuse capable of being either in the ON state or in the OFF state. As mentioned above, the fuse is set to the ON state for the word line 11 where writing is inhibited, while it is set to the OFF state for the word line 11 where writing is permitted. The fuse can be set to the OFF state by cutting part thereof using a laser trimmer or the like. When the semiconductor memory device is provided with a redundant circuit having a fuse, the fabricating process thereof includes a step of cutting part of the fuse. Accordingly, the fuse as the write protect information element 22 can also be cut at this step, and thus there is no increase in the number of steps in the fabrication of the semiconductor memory device of this example.

The potential change element 20 of this example includes a MOSFET of which gate is connected to the word line 11. One of the source/drain of the MOSFET is connected to one end of the fuse as the write protect information element 22. The other one is connected to the signal line 27. The signal line 27 is connected through a resistance 49 to a power source (not shown) which supplies a HIGH-level potential. The other end of the fuse is grounded.

When the word line 11 is selected by the row decoder 13 in accordance with a row address signal transmitted through a row address signal line 10, the potential of the selected word line 11 rises to a HIGH level, and the potential change element (MOSFET) 20 is turned ON. At this time, when the fuse for the selected word line 11 is in the ON state, a current flows through the resistance 49, the signal line 27, the potential change element (MOSFET) 20, and the fuse into the ground. The potential of the signal line 27 at this time is greatly lowered or is "pulled down" to a LOW level from the potential supplied from the power source (5 volts, for example) due to the voltage drop with the resistance 49.

When the potential of the signal line 27 lowers to the LOW level, the LOW-level signal transmitted through the signal line 27 is amplified by a two-stage inverter as the write protect signal output element 28, and the amplified signal is output as a write protect signal to one of the input terminals of the NAND circuit 31 through the write protect signal line 23.

As a result, even if a HIGH-level write enable signal is applied to the other input terminal of the NAND circuit 31 through the WE signal line 24, data from outside (a write signal) is prevented from being output from the write circuit 29 through the common data line 26, as far as the LOW-level write protect signal is applied to the NAND circuit 31. As a result, data from outside is not supplied to the bit line 21 which has been selected by the column decoder 14 in accordance with the column address signal transmitted through a column address signal line 9. Thus, data is not written on the memory cell 15 connected to the selected word line 11 and the selected bit line 21.

On the other hand, when the fuse for the selected word line 11 is in the OFF state, a current does not flow through the resistance 49, the signal line 27, the potential change element (MOSFET) 20, and the fuse into the ground. Accordingly, since the voltage drop with the resistance 49 does not occur, the potential of the signal line 27 is kept in the HIGH level.

When the potential of the signal line 27 is kept in the HIGH level, the HIGH-level signal transmitted through the signal line 27 is amplified by the two-stage inverter as the write protect signal output element 28, and the amplified signal is output as a write permit signal to one of the input terminals of the NAND circuit 31 through the write protect signal line 23.

As a result, when the HIGH-level write enable signal is applied to the other input terminal of the NAND circuit 31 through the WE signal line 24, data from outside is supplied from the write circuit 29 through the common data line 26 to the bit line 21 selected by the column decoder 14. Thus, data is written on the memory cell 15 connected to the selected word line 11 and the selected bit line 21.

As described above, according to the semiconductor memory device of this example, ROM data stored in a memory area used in place of a ROM can be protected from being mistakenly overwritten due to a malfunction of the CPU or other causes. Thus, the reliability of the device is much improved. Moreover, such a ROM area can be flexibly defined by each word line depending on the amount of the ROM data to be stored.

The resistance 49 between the power source and the signal line 27 can be replaced with a switching element. In this case, the switching element is turned ON prior to the selection of the word line 11 to precharge the signal line 27. Then, the switching element is turned OFF when the word line 11 is selected, allowing the signal line 27 to have a potential independent from the potential of the power source. Thus, in this alternative embodiment, it is also possible to detect the state stored in the write protect information element 22 through the potential of the signal line 27.

According to this example, a plurality of potential change elements 20 corresponding to a plurality of word lines 11 in each memory block are connected to a single write protect detection element 18 through an extended single signal line 27. However, a plurality of the write protect detection elements 18 and the signal lines 27 can also be used depending on the design of the memory block.

Further, according to this example, the ON state of the fuse corresponds to the "write permit information" and the OFF state thereof corresponds to the "write protect information". However, it is also possible to be set so that the OFF state of the fuse corresponds to the "write permit information" and the ON state thereof corresponds to the "write protect information". This can be made by using a three-stage inverter instead of the two-stage inverter of this example. In this modification, when the potential of the signal line 27 is lowered to the LOW level, for example, the LOW-level signal is amplified and inverted to the HIGH level by the three-stage inverter as the write protect signal output element 28, and is output to one of the input terminals of the NAND circuit 31.

EXAMPLE 2

Figure 3A:
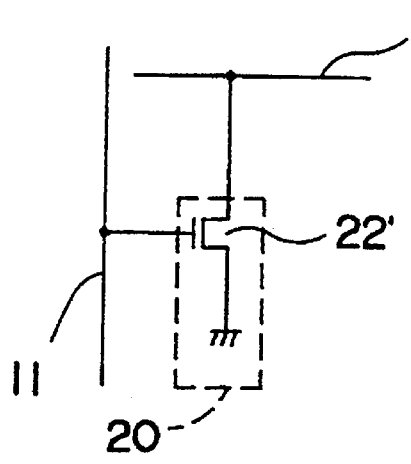
FIGS. 3a and 3b are circuit diagrams of write protect information elements of a second example and a third example according to the present invention, respectively.

Referring to FIG. 3a, the main difference of this example from Example 1 is that a write protect information element 22' is a MOSFET having two alternative states in which the inversion threshold voltages are different. Such a MOSFET also functions as the potential change element 20 in Example 1.

According to the semiconductor memory device of this example, the MOSFET for the word line 11 where writing is inhibited is set to have a low inversion threshold voltage, while the MOSFET for the word line 11 where writing is permitted is set to have a high inversion threshold voltage. The inversion threshold voltage of the MOSFET is controlled by changing the doping level of impurities at the channel doping of the MOSFET. More specifically, the channel region of a MOSFET of which inversion threshold voltage should be high is selectively implanted with impurity ions having a conductivity type effective for increasing the inversion threshold voltage. At this ion implantation, the channel region of a MOSFET of which inversion threshold voltage should be low is covered with an ion implantation mask (typically, a photoresist mask) to prevent it from being implanted with such impurity ions. Thus, according to this example, the threshold level of the MOSFET can be set as desired by a conventional lithographic process and ion implantation process. It is therefore easy to store write permit information or write protect information in the write protect information element 22' for a specified word line 11.

As mentioned above, the MOSFET as the write protect information element 22' also functions as the potential change element 20 in Example 1. That is, the gate of the MOSFET is connected to the word line 11, one of the source/drain thereof is grounded and the other one is connected to the signal line 27.

In the above-described structure, when the word line 11 is selected by the row decoder 13 (FIG. 2), the potential of the word line 11 rises to the HIGH level. At this time, when the MOSFET connected to the selected word line 11 has a low inversion threshold level, it is turned ON. This causes a current to flow from the power source through the resistance 49 (FIG. 2), the signal line 27, and the MOSFET into the ground, thereby pulling down the potential of the signal line 27.

On the other hand, when the MOSFET connected to the selected word line 11 has a high inversion threshold level, it is not turned ON. This does not cause a current to flow from the power source through the resistance 49, the signal line 27, and the MOSFET into the ground, thereby keeping the signal line 27 in the HIGH level. In other words, in order to obtain the OFF state of the MOSFET, the inversion threshold voltage of the MOSFET should be high enough to keep the MOSFET in the OFF state when the potential at the gate rises to be equal to that of the selected word line 11 (approximately 5 volts, for example).

According to this example, the write protect information element 22' can be formed at a step for fabricating MOSFETs constituting a normal circuit in the semiconductor memory device. Thus, the manufacturing process of the semiconductor memory device of this example can be simplified compared with that of Example 1.

EXAMPLE 3

Figure 3B:
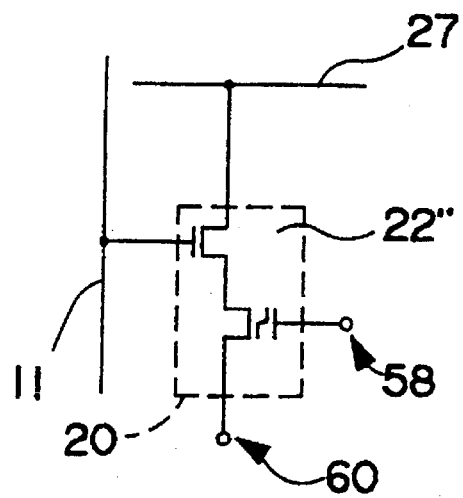

Referring to FIG. 3b, the main difference of this example from Example 1 is that a write protect information element 22" is a floating-gate type EEPROM element (FAMOS) capable of being either in the ON state or in the OFF state. As in Example 2, the FAMOS also functions as the potential change element 20 in Example 1.

According to the semiconductor memory device of this example, the FAMOS for the word line 11 where writing is inhibited is set to the ON state in which the inversion threshold voltage is low, while the FAMOS for the word line 11 where writing is not inhibited is set to the OFF state in which the inverted threshold voltage is high. The inversion threshold voltage of the FAMOS is controlled by changing the potential at the floating gate of the FAMOS. More specifically, electrons are injected to the floating gate of the FAMOS by grounding a source terminal 60 thereof and applying a specified high voltage to a control gate terminal 58 thereof. On the other hand, the electrons are released from the floating gate by grounding the control gate terminal 58 and applying a specified high voltage to the source terminal 60. The inversion threshold voltage of the FAMOS can be repeatedly changed by repeating the above two operations.

As described above, according to this example, it is possible to alter the ON state to the OFF state, or vice versa, stored in the write protect information element 22". Thus, the write prohibit area used as ROM can be flexibly defined or changed depending on the amount of the ROM data to be stored.

EXAMPLE 4

Figure 4:
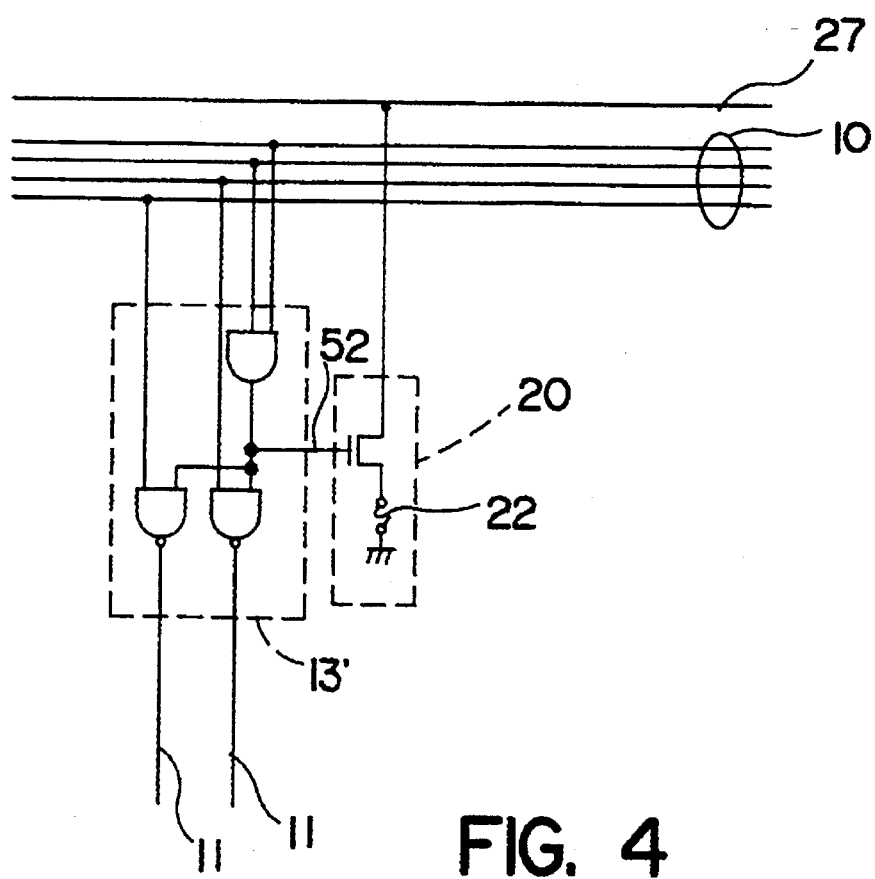
FIG. 4 is a schematic view showing the main portion of the semiconductor memory device of a fourth example according to the present invention.

Referring to FIG. 4, the main difference of this example from Example 1 is that the single write protect information element 22 stores write protect information for two adjacent word lines 11.

According to the semiconductor memory device of this example, in the case that the write protect information element 22 stores the write protect information, when one of the two word lines 11 is selected by a row decoder 13' in accordance with a row address signal transmitted through the row address signal line 10, the potential of a node 52 rises to the HIGH level. At this time, as described in Example 1, the write circuit 29 (not shown in FIG. 4) does not output a data signal, so that no data is written on the memory cell 15 (not shown in FIG. 4) connected to the selected word line 11.

According to this example, the area occupied by the write protect information element 22 on a chip can be reduced. The write protect information element 22 can also be designed to store write protect information for three or more word lines 11. Thus, the write protect area used as a ROM can be flexibly defined by at least every two word lines depending on the amount of the ROM data to be stored.

EXAMPLE 5

Figure 5:
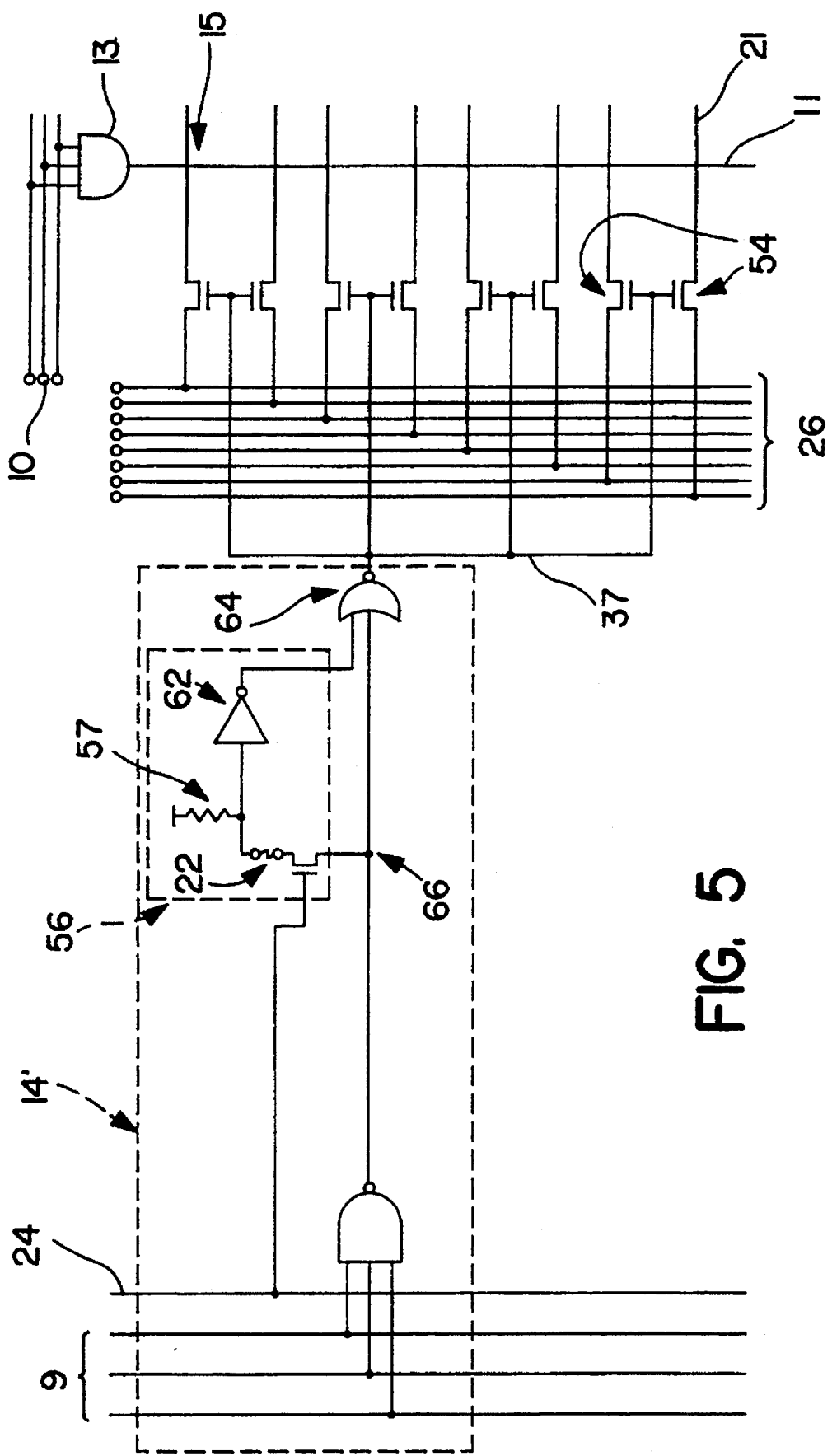
FIG. 5 is a schematic view showing the main portion of the semiconductor memory device of a fifth example according to the present invention.

FIG. 5 shows a schematic structure of the main portion of the semiconductor memory device of this example. Unlike the former examples, a column decoder 14' of this example includes the write protect information element 22 which stores write permit or protect information for the bit line 21 and a write protect detection element 56 which changes the output level of the column selective signal in accordance with the information stored in the write protect information element 22 for the bit line 21 selected by the column decoder 14'.

Figure 6:
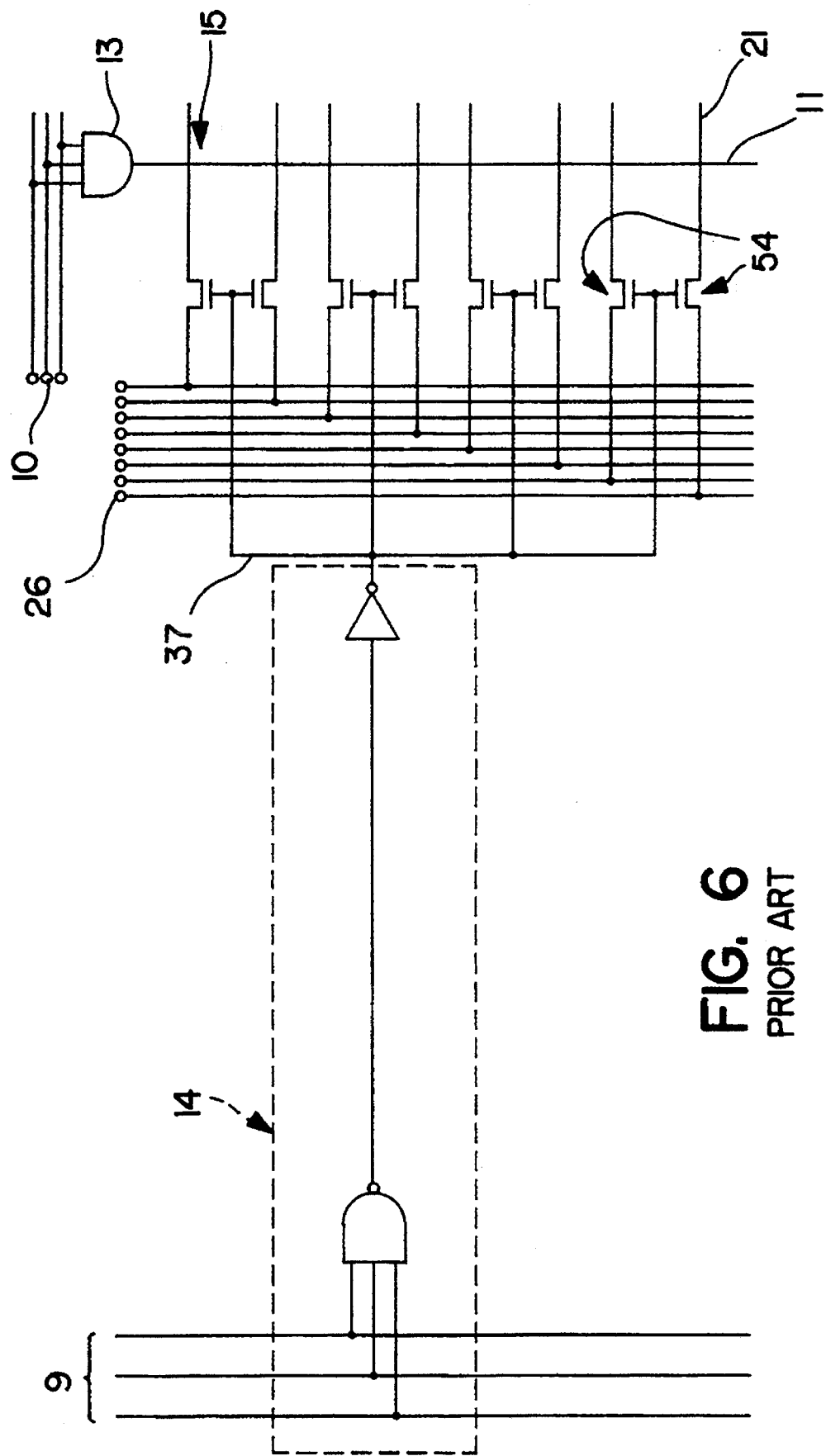
FIG. 6 is a schematic view showing the main portion of a conventional semiconductor memory device.

FIG. 6 shows a portion of a conventional semiconductor memory device corresponding to the portion shown in FIG. 5 for reference. As is shown in FIG. 6, in the conventional semiconductor memory device, each of the column decoders 14 connected to the column address signal line 9 (only one column decoder 14 is shown in FIG. 6) outputs a column selective signal to a column selective signal line 37 in accordance with the column address signal. The column selective signal line 37 is connected to the gates of switching elements 54 formed between the common data lines 26 and the bit lines 21. The main difference between the semiconductor memory device of this example and the conventional one is that the column decoder 14' of this example is provided with the write protect information element 22 and the write protect detection element 56 as mentioned above.

Now, referring to FIG. 5, the semiconductor memory device of this example will be described. The device includes the row decoder 13 which outputs the row selective signal in accordance with a row address signal, the word lines 11 connected to the row decoder 13, the column decoder 14' which outputs a column selective signal in accordance with a column address signal, the switching elements 54 connected to the column selective signal line 37, the common data lines (I/O lines) 26 transmitting a data signal in accordance with data from outside, the bit lines 21 connected to the common data lines 26 through the switching elements 54, and the memory cells 15 connected to the word lines 11 and the bit lines 21.

The column decoder 14' of this example includes the write protect information element 22 which stores write permit or protect information for four pairs of bit lines 21 and the write protect detection element 56 which changes the output level of the column selective signal in accordance with the information stored in the write protect information element 22 for the bit lines 21 selected by the column decoder 14'.

The write protect information element 22 in this example is a fuse as in Example 1. However, it can also be a MOSFET or an EEPROM as in the former examples.

The WE signal line 24 is connected to the gate of a MOSFET in the write protect detection element 56. One of the source/drains of the MOSFET is connected to the power source through the fuse as the write protect information element 22 and a resistance 57, and the other source/drain of the MOSFET is connected to a node 66 in the column decoder 14'. The input terminal of an inverter 62 is connected between the resistance 57 and the fuse, and the output terminal thereof is connected to one of the input terminals of a NOR circuit 64. The other input terminal of the NOR circuit 64 is connected to the node 66. The output terminal of the NOR circuit 64 is connected to the column selective signal lines 37.

Now, the operation of the semiconductor memory device of this example will be described. At a write cycle period, when all of the column address signals supplied through three column address signal lines 9 are in the HIGH level in order to select the four pairs of bit lines 21, the level at the node 66 in the column decoder 14' becomes LOW. At this time, when the fuse as the write protect information element 22 is in the OFF state, the input to the inverter 62 is kept in the HIGH level by the power supply from the power source. Accordingly, the signals sent to the two input terminals of the NOR circuit 64 are of the LOW level. This level at the NOR circuit 64 has not been affected by the level of the WE signal transmitted through the WE signal line 24. This results in that the column decoder 14' outputs the column selective signal of the HIGH level to the column selective signal lines 37. Thus, when the WE signal of the HIGH level is being input to the write circuit 29 (not shown in FIG. 5), the column decoder 14' for the selected bit lines 21 outputs a HIGH level signal to the column selective signal lines 37, thereby turning the switching element 54 ON. This allows for writing of data on the memory cells 15 connected to the selected four pairs of bit lines 21.

Then, the case when the fuse as the write protect information element 22 is in the ON state will be described. When the WE signal supplied through the WE signal line 24 is in the LOW level, since the MOSFET in the column decoder 14' is in the OFF state, the input to the inverter 62 is kept in the HIGH level by the power supply from the power source. Accordingly, the signals sent to the two input terminals of the NOR circuit 64 are of the LOW level. This results in that the column decoder 14' outputs the column selective signal of the HIGH level to the column selective signal lines 37.

When the WE signal is in the HIGH level, since the MOSFET in the column decoder 14' is in the ON state, the input to the inverter 62 is pulled down to the level at the node 66, that is, the LOW level. The inverter 62 inverts the level of the signal to the HIGH level, and the HIGH and LOW levels of signals are input to the NOR circuit 64. This results in that the column decoder 14' outputs the column selective signal of the LOW level to the column selective signal lines 37. Thus, when the WE signal of the HIGH level is being input to the write circuit 29 (not shown in FIG. 5), the column decoder 14' for the selected bit lines 21 outputs a LOW-level signal to the column selective signal lines 37, thereby turning the switching element 54 OFF. This prevents data writing on the memory cells 15 connected to the selected four pairs of bit lines 21.

According to this example, when the write protect information element 22 for the four pairs of bit lines 21 selected in accordance with the column address signal stores the write protect information, the column selective signal is not output from the column decoder 14'. This results in that a data signal supplied through the common data lines 26 of the write circuit 29 (not shown in FIG. 5) is not sent to the four pairs of bit lines 21.

The write protect information element 22 of this example is provided for one column selective signal line 37 connected to each column decoder 14'. However, the write protect information element 22 may be provided for any number of column selective signal lines 37. Further, in this example, eight bit lines 21 for one column decoder 14' can be connected to the common data lines 26, but the number of bit lines 21 to be connected to one column decoder 14' is optional.

As described above, according to the semiconductor memory device of this example, ROM data stored in a memory area used in place of a ROM can be protected from being overwritten mistakenly due to a malfunction of the CPU or other causes. Thus, the reliability of the device improves. Moreover, such a ROM area can be flexibly defined at least by each bit line depending on the amount of the ROM data to be stored.

Further, the present invention can provide a semiconductor memory device which has both RAM areas and ROM areas mixed on one chip in a simple construction, so that the area on a computer board on which the semiconductor memory device is mounted can be reduced.

EXAMPLE 6

Figure 11:
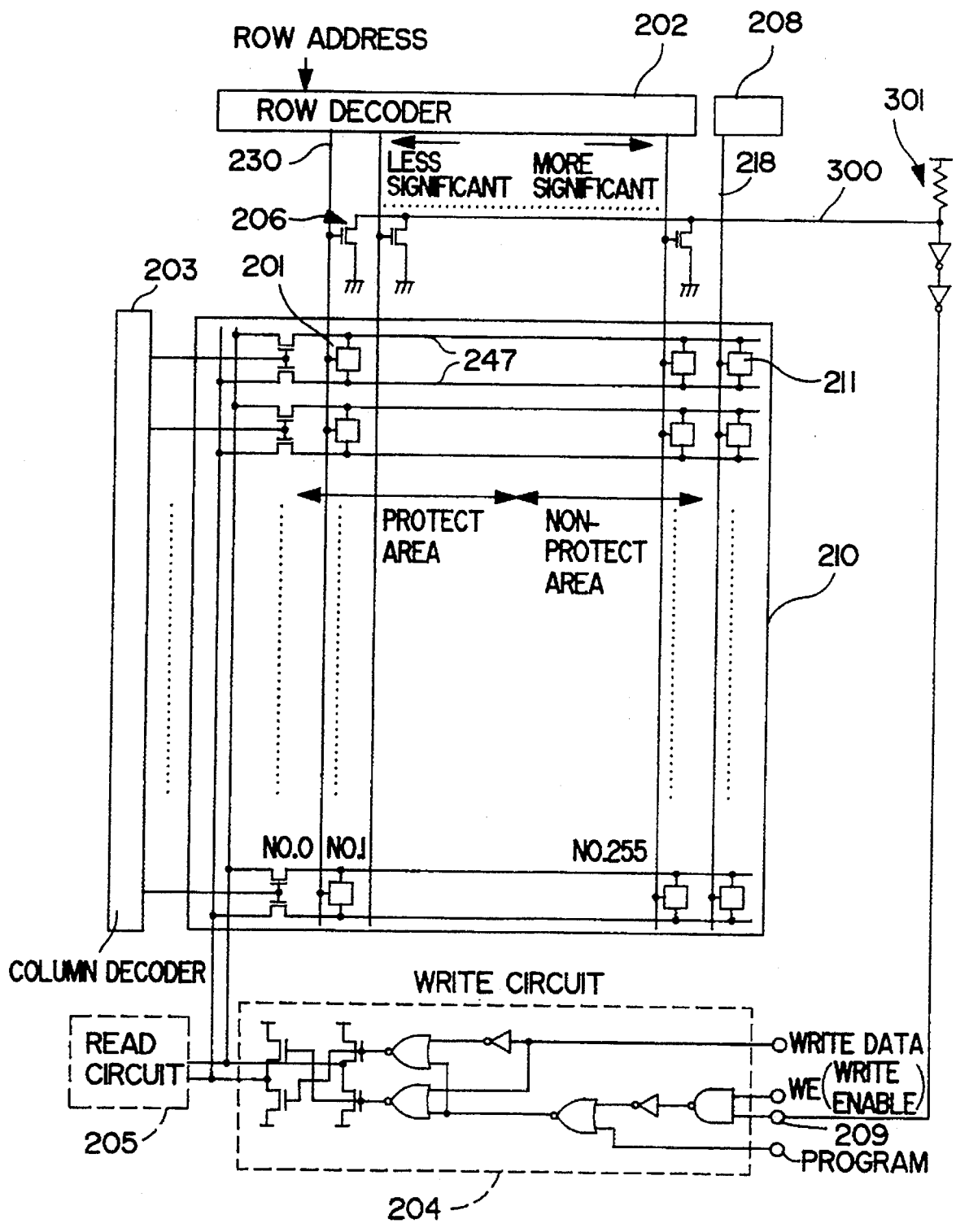
FIG. 11 is a schematic view showing the main portion of a semiconductor memory device.

FIG. 11 schematically shows an example of a memory block of a semiconductor memory device in which part of the memory space is protected from writing. Referring to FIG. 11, the memory block includes a memory cell array 210 having a plurality of memory cells 201 arranged in a matrix, a row decoder 202 and a column decoder 203 both for selecting one of the memory cells 201 in the memory cell array 210, a write circuit 204 for writing data on the selected memory cell 201, a read circuit 205, a plurality of word lines 230, and a plurality of pairs of bit lines 247.

The memory block includes a total of 256 word lines 230. In this example, the row decoder 202 decodes row addresses (RA0 to RA7) to select one word line 230 from the 256 word lines 230. The word line 230 selected when all of the row addresses (RA0 to RA7) are 0 is denoted by No.0, while the word line 230 selected when all of the row addresses (RA0 to RA7) are 1 denoted by No.255.

The semiconductor memory device of FIG. 11 is provided with a write protect means. The write protect means includes a protect setting element 206 provided for each word line 230. In FIG. 11, the protect setting element 206 is a transistor of which gate is connected to the word line 230. One of the source/drains of the transistor is connected to a pullup element 301 through a common signal line 300, and the other is grounded. As described later, by changing the threshold voltage of the transistor, a write protect area can be defined by each word line 230.

The write circuit 204 includes an input terminal 209 for receiving a protect signal sent from the write protect means. Other input terminals of the write circuit 204 are a data terminal for receiving write data, a write enable (WE) terminal for receiving a WE signal from outside which indicates write instruction, and a program terminal. In the case that the program terminal is in the LOW level, data can be written on the selected memory cell 201 through the write circuit 204 only when both the WE signal and the protect signal are in a HIGH level. When the protect signal is in a LOW level, data will not be written even when the WE signal is in the HIGH level. On the other hand, when the program terminal is set to the HIGH level, a program can be written on the write protect area.

The memory cell block of the semiconductor memory device of FIG. 11 has two different areas, a write protect area and a write permit area. The write protect area may include No.0 to No.127 word lines 230 while the write permit area may include No.128 to No.255 word lines 230, for example. In this case, the threshold voltage of all of the protect setting elements 206 corresponding to No.0 to No.127 word lines 230 is set low, and that of the protect setting elements 206 corresponding to No.128 to No.255 word lines 230 is set high. Thus, for any of No.0 to No.127 word lines 230, when the word line 230 is not selected and kept in the LOW level, the transistor of the corresponding protect setting element 206 is in the OFF state. When the word line 230 is selected and changed to the HIGH level, the transistor of the corresponding protect setting element 206 is turned to the ON state. For any of No.128 to No.255 word lines 230, the transistor of the corresponding protect setting element 206 is kept in the OFF state regardless of the word line 230 being selected or not. The threshold voltage of the transistor of each protect setting element 206 is set high or low by using a mask as is done when data are written on a ROM.

Next, the operation of the write protect means will be described. When any of No.0 to No.127 word lines 230 is selected, the transistor of the protect setting element 206 corresponding to the selected word line 230 is turned ON. At this time, the signal line 300 is grounded through the transistor, thus pulling down the potential of the signal line 300 to the LOW level. The LOW-level potential of the signal line 300 is transmitted to the input terminal 209 of the write circuit 204 through a two-stage inverter as the protect signal, thus lowering the input terminal 209 to the LOW level. As a result, write data is not sent through the write circuit 204 to the selected word line 230. On the other hand, when any of No.128 to No.255 word lines 230 is selected, the transistor of the protect setting element 206 corresponding to the selected word line 230 is kept OFF. Accordingly, the signal line 300 is kept in the HIGH level through the pullup element 301. The HIGH-level potential of the signal line 300 is transmitted to the input terminal 209, thus keeping the input terminal 209 in the HIGH level. As a result, when the WE signal is also in the HIGH level, write data can be sent to the selected signal line 230.

The semiconductor memory device is generally provided with a redundant means for the remedy of a defect bit. Referring to FIG. 11, the operation of such a redundant means will be described.

The redundant means includes, for example, a plurality of redundant memory cells 211, a redundant word line 218 connected to the redundant memory cells 211, and a redundant row decoder 208 for selecting the redundant word line 218. When a defect memory cell is found in the memory block, the word line 230 connected to the defect memory cell is replaced with the redundant word line 218. This replacement includes setting a row address corresponding to the word line 230 to be replaced in the redundant row decoder 208 and inactivating this word line 230 in the row decoder 202. This is practically achieved by laser trimming.

Figure 12A:
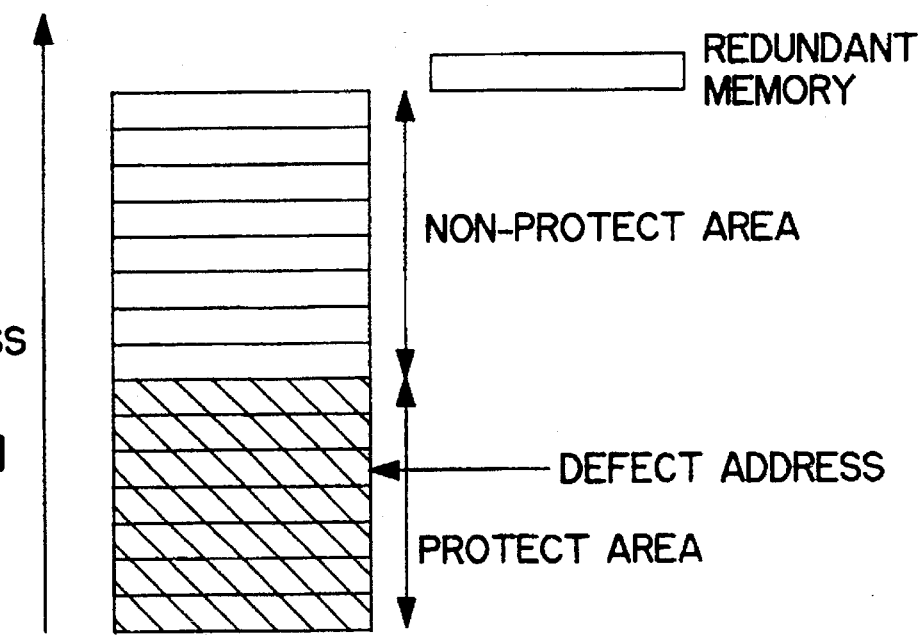
FIGS. 12a and 12b are simplified memory maps to illustrate a problem to be solved by the present invention.
Figure 12B:
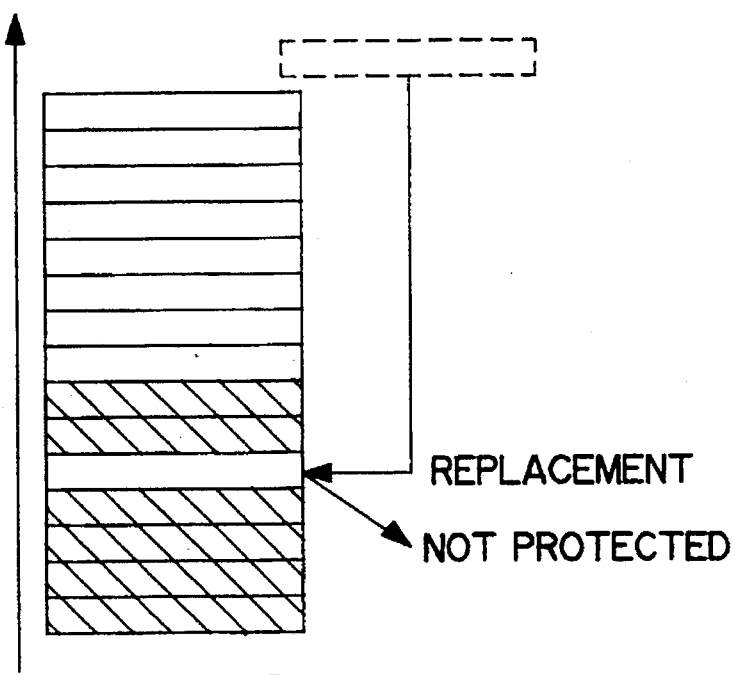

The redundant word line 218 in FIG. 11 is not protected from writing. Therefore, a problem arises when the defect memory cell is found in the write protect area. The word line 230 connected to the defect memory cell is replaced with the redundant word line 218 which is not protected from writing. This problem will be described with reference to FIGS. 12a and 12b each of which shows part of an outlined memory map. When a defect address is found in the write protect area as is shown in FIG. 12a, since a redundant memory to replace the defect memory is not protected from writing, the write protect area is altered after the replacement as is shown in FIG. 12b. Likewise, when the redundant word line 218 is protected from writing and a defect memory cell is found in the write permit area, the word line 230 connected to the defect memory cell is replaced with the redundant word line 218 which is protected from writing.

Thus, when the semiconductor memory device having a write protect area in each memory block is provided with a redundant means, the write protect area may be altered after the remedy by the redundant means.

Figure 8:
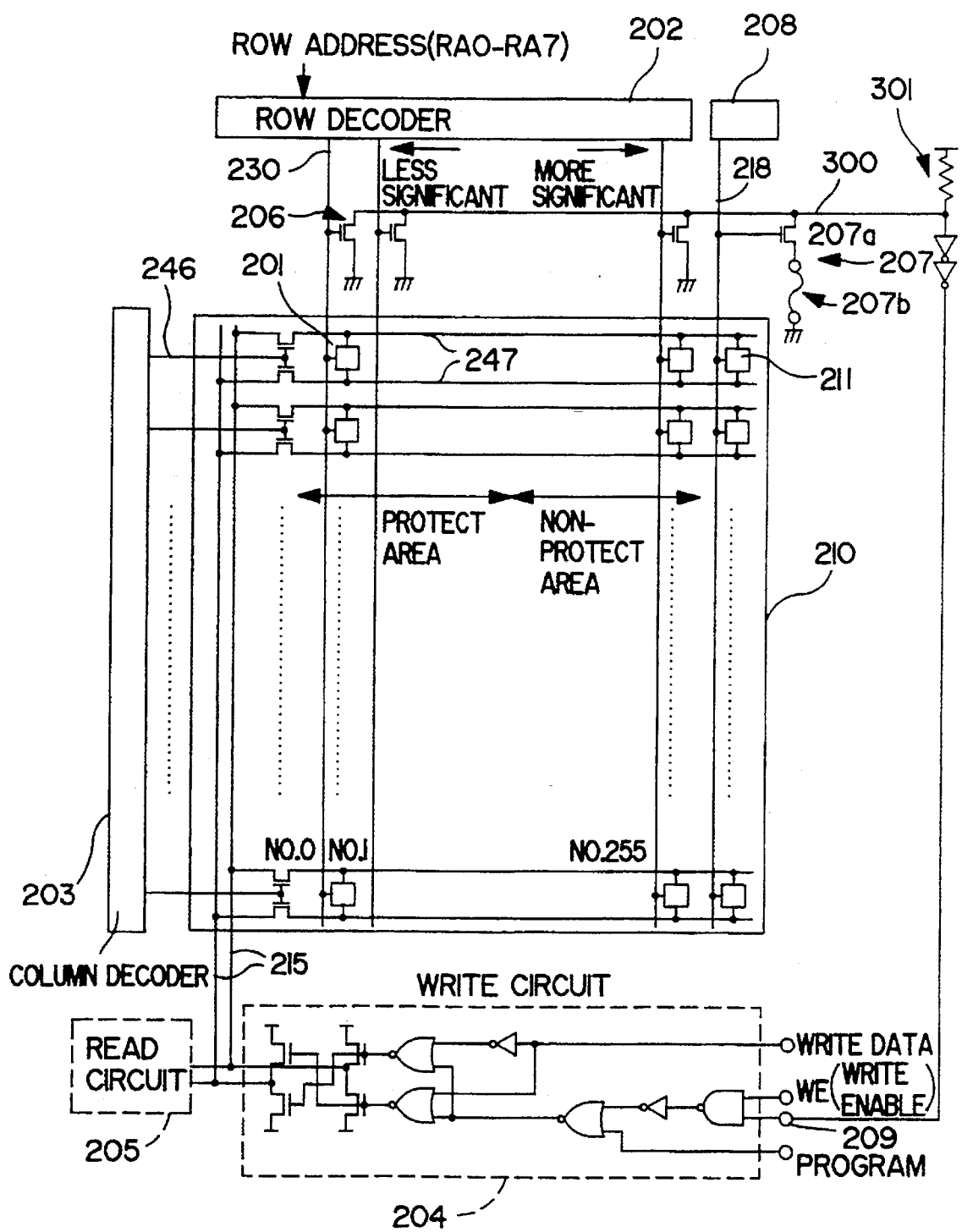
FIG. 8 is a schematic view showing the main portion of the semiconductor memory device of a sixth example according to the present invention.

FIG. 8 shows a memory block of the semiconductor memory device of this example according to the present invention. The memory block includes the same components as those shown in FIG. 11. Each memory cell 201 is connected to one of the word lines 230 and one pair of the bit lines 247. Each of the pair of bit lines 247 is connected to each of the data lines 215 through a transistor. The transistor is turned ON or OFF in response to a column selective signal 246 output from the column decoder 203. The data lines 215 are connected to the write circuit 204 and the read circuit 205.

The semiconductor memory device according to the present invention further includes a redundant protect setting element 207 for setting the write protect for the redundant memory cells 211 when required. As is shown in FIG. 8, the redundant protect setting element 207 has a simple structure composed of a transistor 207a and a fuse 207b. The transistor 207a is a MOSFET having a gate and source/drain. The gate is connected to the redundant word line 218, while one of the source/drain is connected to the signal line 300 and the other is grounded through the fuse 207b. Thus, the redundant protect setting element 207 is connected in parallel with the protect setting elements 206 for the word lines 230.

The redundant protect setting element 207 is set to protect the redundant memory cells 211 when a defect memory cell is found in the write protect area. On the contrary, it is set not to protect the redundant memory cells 211 when a defect memory cell is found in the write permit area. This setting is performed by cutting the fuse 207b for protecting the redundant memory cells 211.

Then, the remedy of the defect memory cell by the redundant means of this example will be described in more detail. First, a row address for the word line 230 connected to the defect memory cell is established in the redundant row decoder 208, and this word line 230 is inactivated in the row decoder 202. This is practically achieved by a step of melting related fuses disposed in the row decoder 202 and the redundant row decoder 208 by laser trimming. When the defect memory cell is found in the write protect area, the fuse 207b of the redundant protect setting element 207 is also cut by laser trimming at the above step. On the other hand, when the defect memory cell is found in the write permit area, the fuse 207b is kept intact.

The redundant word line of this example has a predetermined unit capacity, and the defect memory cell is replaced with the redundant memory cell by the unit capacity. The redundant means may include a plurality of redundant word lines 218. In this case, each of the redundant word lines 218 is provided with the redundant protect setting element 207.

EXAMPLE 7

Figure 9:
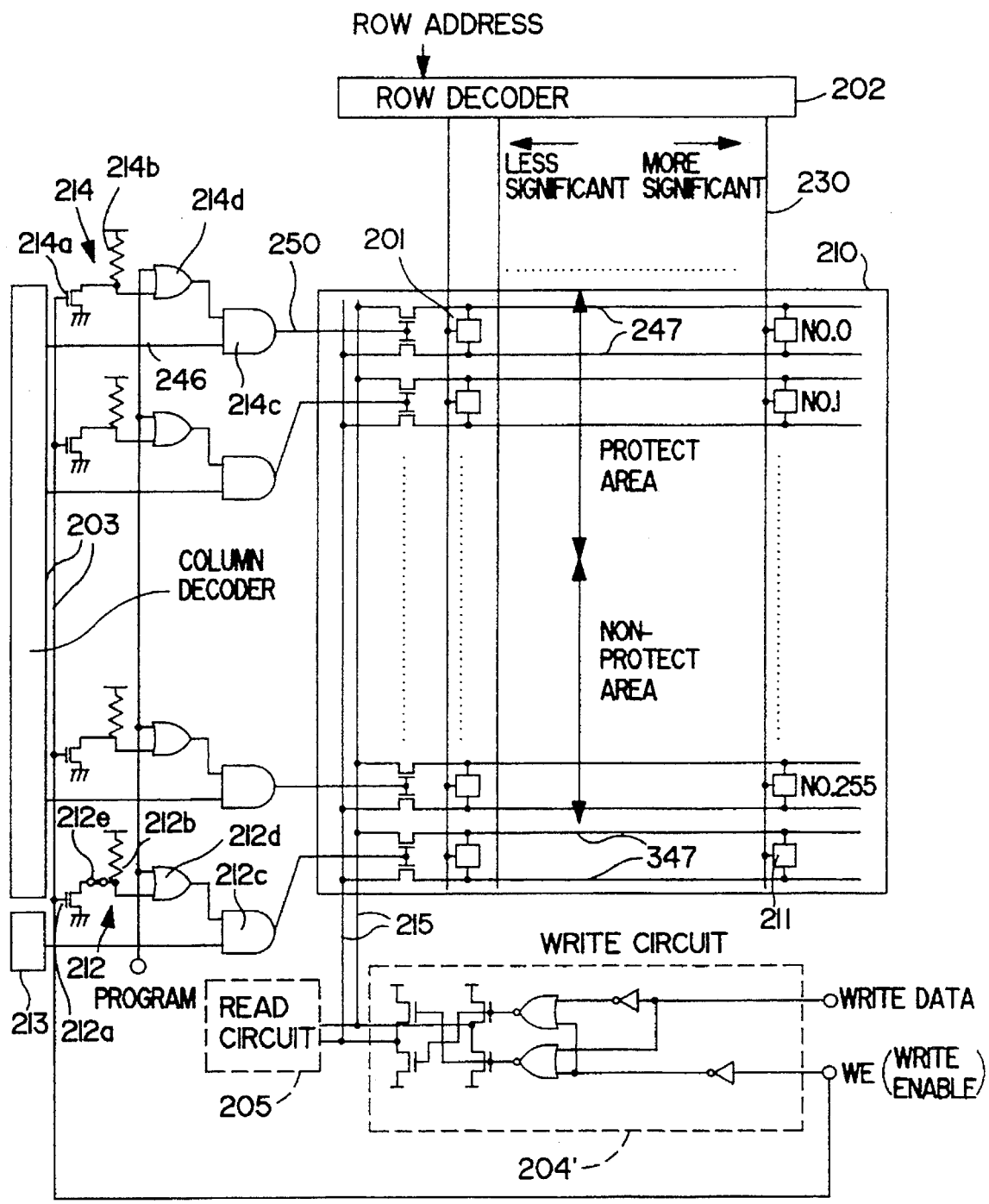
FIG. 9 is a schematic view showing the main portion of the semiconductor memory device of a seventh example according to the present invention.

FIG. 9 shows a memory block of the semiconductor memory device of this example according to the present invention. The memory block of this example includes the memory cell array 210 having a plurality of memory cells 201 arranged in a matrix, the row decoder 202 and the column decoder 203 both for selecting one of the memory cells 201 in the memory cell array 210, a write circuit 204' for writing data on the selected memory cell 201, the read circuit 205 for reading data from the selected memory cell 201, the redundant memory cells 211 for replacing defect memory cells found in the memory cell array 210, a pair of redundant bit lines 347 connected to the redundant memory cells 211, and a redundant column decoder 213 for selecting the pair of redundant bit lines 347.

The semiconductor memory device of this example includes a protect setting element 214 provided for each pair of bit lines 247, that is, for each column address. The protect setting element 214 includes a transistor 214a, a pullup element 214b, an AND gate 214c, and an OR gate 214d. The gate of the transistor 214a receives the WE signal. One of the source/drains of the transistor 214a is connected to the pullup element 214b and a second input terminal of the OR gate 214d, and the other is grounded. A first input terminal of the OR gate 214d is connected to the program terminal, and an output terminal of the OR gate 214d is connected to a first input terminal of the AND gate 214c. A second input terminal of the AND gate 214c is connected to the column decoder 203. The memory space of the semiconductor memory device of this example has a write protect area and a write permit area which are defined by each column address.

Now, how the write protect area or the write permit area is determined by each column address will be described. On receipt of the WE signal, the write circuit 204' of this example sends write data to the data lines 215. However, when the pair of bit lines 247 selected by the column decoder 203 are in the write protect area, the pair of bit lines 247 are disconnected from the data lines 215 depending on an output 250 from the protect setting element 214, thereby effecting the write protect for the selected pair of bit lines 247.

The operation when the program terminal is in the LOW level will be described in more detail. The transistors 214a of the protect setting element 214 in the write permit area have a high threshold voltage. Accordingly, each of these transistors 214a is kept OFF regardless of the gate of the transistor 214a being in the HIGH level or in the LOW level. As a result, the second input terminal of the OR gate 214d which is connected to the pullup element 214b is kept in the HIGH level at any time. This allows the OR gate 214d to output a HIGH-level signal to the first input terminal of the AND gate 214c. Accordingly, when the second input terminal of the AND gate 214c receives a HIGH-level column selective signal 246 from the column decoder 203, the pair of bit lines 247 and the data lines 215 are connected.

On the other hand, the transistors 214a of the protect setting element 214 in the write protect area have a low threshold voltage. Accordingly, each of these transistors 214a is turned ON when the gate of the transistor 214a is in the HIGH level, and is turned OFF when gate of the transistor 214a is in the LOW level. As a result, when the WE signal is in the LOW level, the second input terminal of the OR gate 214d is kept in the HIGH level by the pullup element 214b. However, when the WE signal is in the HIGH level, the transistor 214a is turned ON, so that the second input terminal of the OR gate 214d is lowered to the LOW level. As a result, the output 250 from the AND gate 214c is in the LOW level. Accordingly, even when the pair of bit lines 247 are selected and the second input terminal of the AND gate 214c receives the HIGH-level column selective signal 246 from the column decoder 203, the pair of bit lines 247 are disconnected from the data lines 215 as far as the HIGH-level WE signal is supplied. The threshold voltage of the transistors 214a is set high or low by using a mask as is done when data are written on a ROM.

The semiconductor memory device of this example further includes a redundant protect setting element 212 for the pair of redundant bit lines 347. The redundant protect setting element 212 includes a transistor 212a, a pullup element 212b, an AND gate 212c, an OR gate 212d, and a fuse 212e. The gate of the transistor 212a receives the WE signal. One of the source/drain of the transistor 212a is connected to the pullup element 212b and a second input terminal of the OR gate 212d through the fuse 212e, and the other is grounded. A first input terminal of the OR gate 212d is connected to the program terminal, and an output terminal of the OR gate 212d is connected to a first input terminal of the AND gate 212c. A second input terminal of the AND gate 212c is connected to the redundant column decoder 213. The fuse 212e disposed between the transistor 212a and the pullup element 212b can be melted by laser trimming.

At the remedy of a defect memory cell by the redundant means of this example, a column address including the defect memory cell is established in the redundant column decoder 213, and the column signal line (pair of bit lines 230) is inactivated in the column decoder 203. At this time, when the defect memory cell is found in the write protect area, the fuse 212e of the redundant protect setting element is kept intact. On the other hand, when the defect memory cell is found in the write permit area, the fuse 212e is cut by laser trimming. In this way, the redundant column address (redundant pair of bit lines 347 can be protected from writing in the same manner as is done when the column address (pairs of bit lines 247) are protected from writing.

When it is required to write a program on the write protect area, the program terminal is set to the HIGH level. Simultaneously, the WE signal is set to the HIGH level. At this time, the first input terminal of the AND gate 214c is in the HIGH level regardless of the setting of the protect setting element 214, that is, even when the WE signal is in the HIGH level. Thus, the output 250 of the AND gate 214c is in the HIGH level, allowing writing on the memory cells 211 in the write protect area.

Figure 10A:
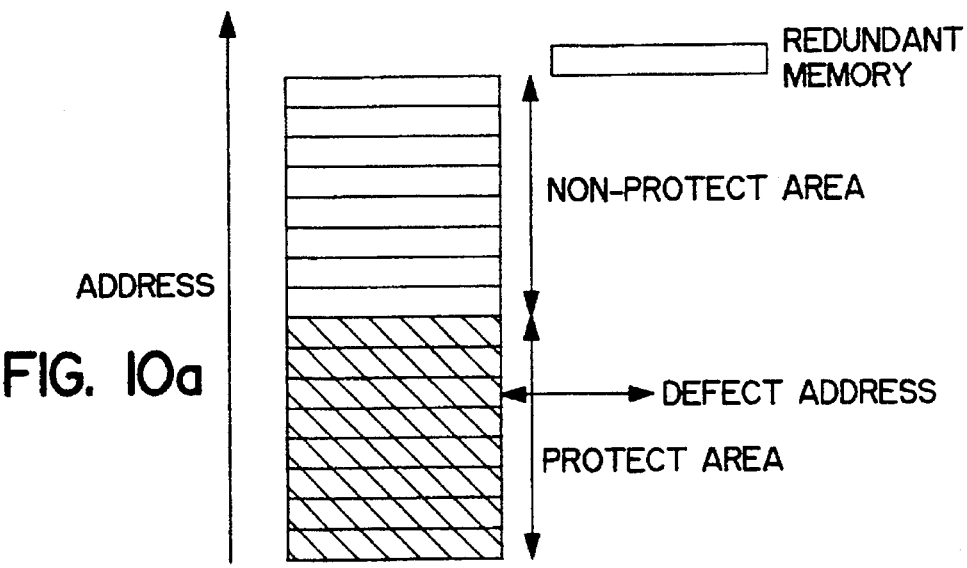
FIGS. 10a, 10b, and 10c are simplified memory maps to illustrate the effect of the present invention.
Figure 10B:
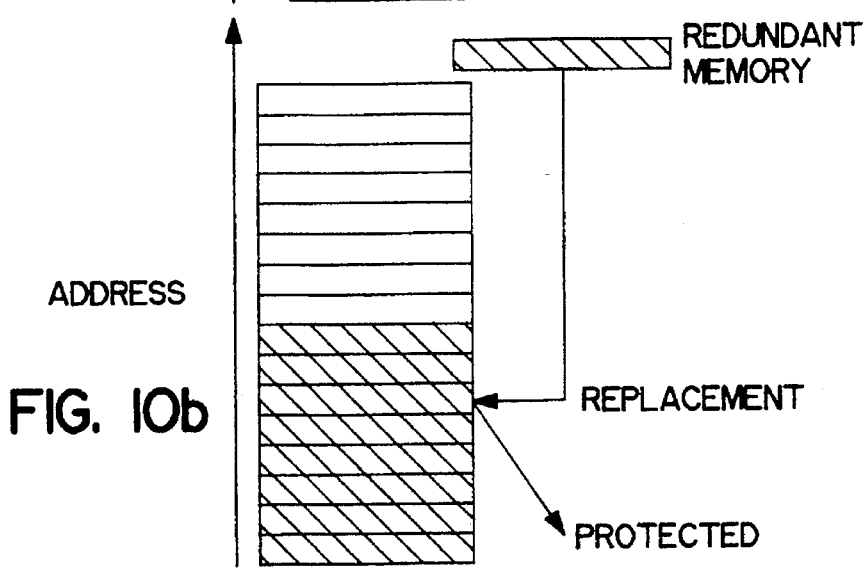
Figure 10C:
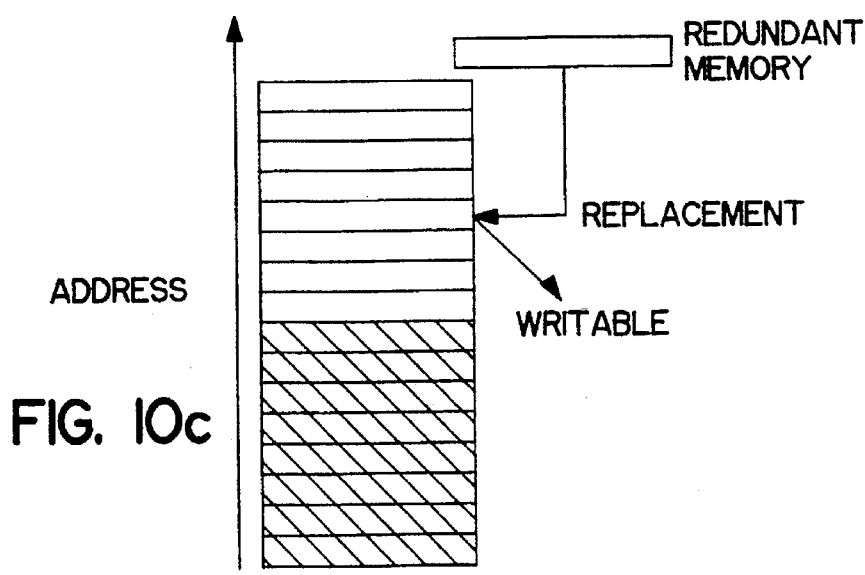

Thus, according to the semiconductor memory device of this example, when a defect address is found in the write protect area as is shown in FIG. 10a, the redundant memory to replace the defect memory is protected from writing as is shown in FIG. 10b. On the other hand, when a defect address is found in the write permit area, the redundant memory to replace the defect memory is not protected as is shown in FIG. 10c.

As described above, according to this example, the redundant memory can be protected from writing or kept unprotected depending on a defect memory to be replaced. Thus, the write protect area and the write permit area can be kept unchanged after the replacement by the redundant means.

EXAMPLE 8

All of the preceding examples relates to nonvolatile read write memories. In the subsequent examples, however, the present invention will be described in relation to a dynamic random access memory (DRAM). First, for easier understanding, a conventional DRAM will be described.

Figure 31:
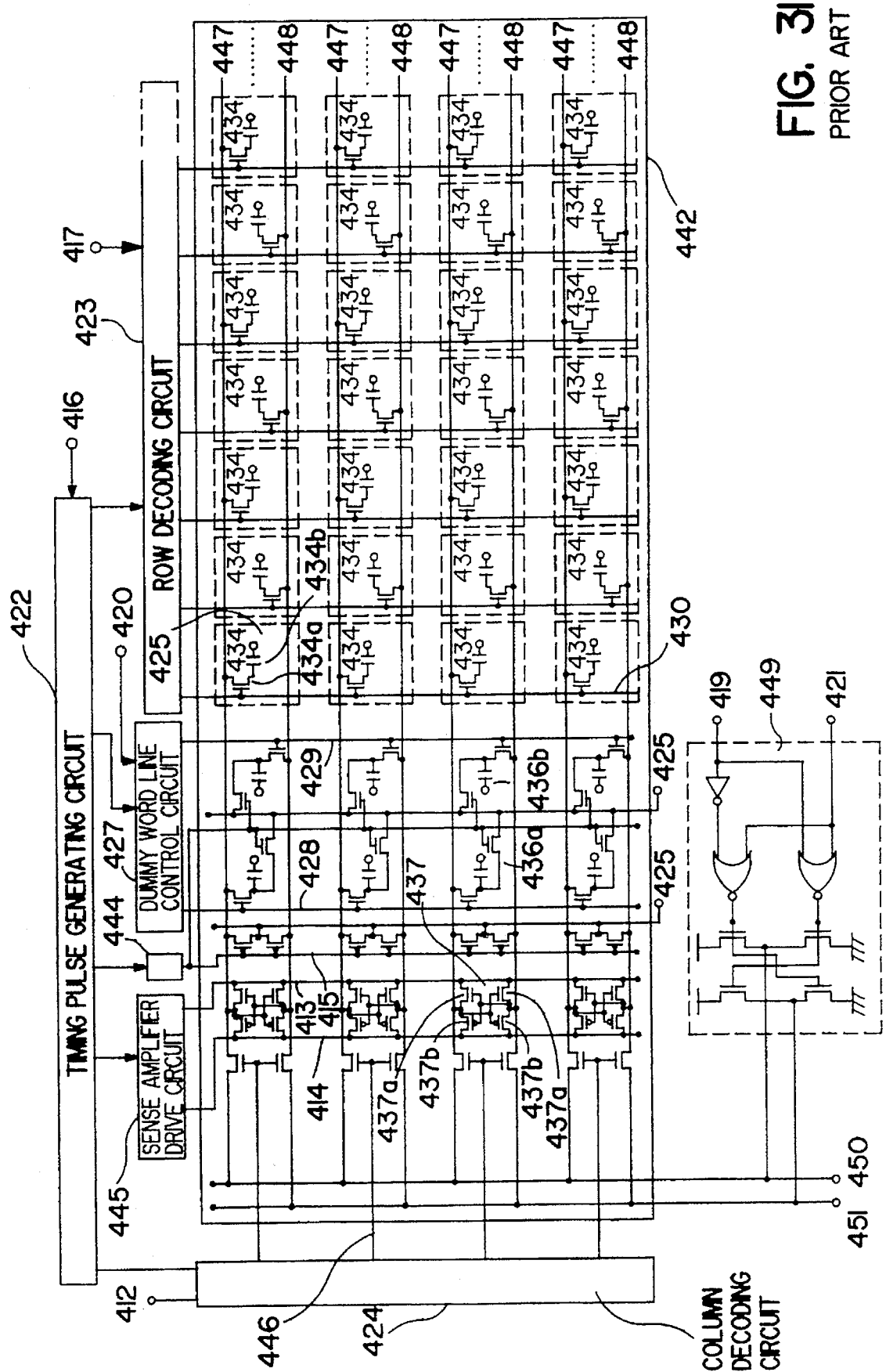
FIG. 31 is a circuit diagram of the main portion of a conventional semiconductor memory device.

A DRAM includes a plurality of memory blocks (memory cell arrays). FIG. 31 shows one of such memory blocks 442 and drive circuits for driving the memory block 442. The memory block 442 includes sense amplifiers 437, first dummy cells 436a, second dummy cells 436b, and memory cells 434. The reference numerals 447 and 448 denote pairs of bit lines. The pair of bit lines 447 and 448 and the memory cells 434 of the DRAM are arranged in a known folded bit line style as is shown in FIG. 31, but the bit lines 447 and 448 can also be arranged in a known open bit line style.

Each of the memory cells 434 includes a transistor 434a and a capacitor 434b. One of terminals of the capacitor 434b is connected to the transistor 434a. The terminal of the capacitor 434b functions as a data memory node. The other terminal 425 thereof is set to a standard potential, ½ Vcc.

The sense amplifiers 437 are connected to a sense amplifier drive circuit 445. The first dummy cells 436a are formed at the crossings of a first dummy word line 428 with the bit lines 447. The second dummy cells 436b are formed at the crossings of a second dummy word line 429 with the bit lines 448. The first and second dummy word lines 428 and 429 are connected to a dummy word line control circuit 427 to receive signals output therefrom. Word lines 430 are connected to a row decoding circuit 423 to receive signals output therefrom. Other drive circuits include a column decoding circuit 424, a timing pulse generating circuit 422, a bit line precharge signal generating circuit 444 and a write circuit 449.

Operations of the above respective circuits will be described as follows:

The timing pulse generating circuit 422 receives a row address strove (RAS) signal 416. In this example, a "high" state of the RAS signal 416 is an "active" state. In response to this signal, the timing pulse generating circuit 422 controls the column decoding circuit 424, the sense amplifier drive circuit 445, the bit line precharge signal generating circuit 444, the dummy word line control circuit 427, and the row decoding circuit 423 in the manner described below for each circuit.

The column decoding circuit 424 receives a column address signal 412 from outside and a pulse signal from the timing pulse generating circuit 422, decodes the column address signal 412, and then outputs a HIGH-level column address selective signal 446 corresponding to the column address signal 412 at an appropriate timing.

The row decoding circuit 423 receives a row address signal 417 from outside and a pulse signal from the timing pulse generating circuit 422, decodes the row address signal 417, and then selectively activates one of the word lines 430, 431, 432, 433, . . . corresponding to the row address signal 417. In the DRAM shown in FIG. 31, the word lines 430, 432, . . . are selected when the least significant bit of the row address RA0 denoted by the reference numeral 420 in FIG. 31 supplied to the dummy word line control circuit 427 is in the LOW level ("0"). On the other hand, the word lines 431, 433, . . . are selected when the least significant bit of the row address RA0 is in the HIGH level ("1").

The sense amplifier drive circuit 445 receives a pulse signal from the timing pulse generating circuit 422 to drive NMOS transistors 437a and PMOS transistors 437b constituting each of the sense amplifiers 437 in the following manner: the level of an NMOS sense amplifier drive signal line 413 connected to the NMOS transistors 437a is lowered from ½ Vcc to the LOW level at an appropriate timing, while the level of a PMOS sense amplifier drive signal line 414 connected to the PMOS transistors 437b is raised from ½ Vcc to the HIGH level.

Figure 32:
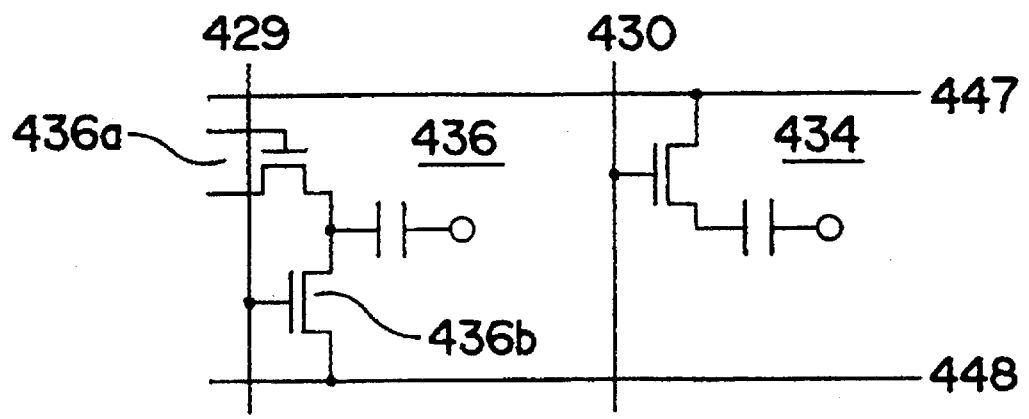
FIG. 32 is a partial circuit diagram of FIG. 31 to show the selection of a dummy cell.

The dummy word line control circuit 427 receives a pulse signal from the timing pulse generating circuit 422 and the least significant bit of the row address RA0 (420). The dummy word line control circuit 427 activates the second dummy word line 429 when RA0 is in the LOW level, and activates the first dummy word line 428 when RA0 is in the HIGH level. When the first dummy word line 428 is activated, the first dummy cells 436a are selected. Likewise, when the second dummy word line 429 is activated, the second dummy cells 436b are selected. In this way, as is shown in FIG. 32, the first or second dummy cells 436a or 436b are selected so that they are connected to the bit line 447 or 448 to which the transistors 434a are not connected.

The first dummy cells 436a operate as follows. When the word line 430 (or 432) is activated, a noise is generated in each bit line 447 through a parasitic capacitance stored between the gate and the source of the transistor 434a of each memory cell 434 connected to the bit line 447. This noise can be canceled by activating the second dummy word line 429 connected to the second dummy cells 436b which are connected to the counterpart bit line 448.

Likewise, the second dummy cells 436b operate as follows. When the word line 431 (or 433) is activated, a noise is generated in each bit line 448 through a parasitic capacitance stored between the gate and the source of the transistor 434a of each memory cell 434 connected to the bit line 448. This noise can be canceled by activating the first dummy word line 428 connected to the first dummy cells 436a which are connected to the counterpart bit line 447.

The bit line precharge signal generating circuit 444 receives a pulse signal from the timing pulse generating circuit 422 and raises a bit line precharge signal line 415 to the HIGH level during an appropriate period of time to precharge the bit lines 447 and 448 to the level of ½ Vcc and at the same time to write the level of ½ Vcc on capacitors of the first and second dummy cells 436a and 436b.

The write circuit 449 includes an inverter and NOR gates. On receipt of a write enable (WE) signal 421 and data 419 from outside, the write circuit 449 sends the data to the bit lines 447 and 448 selected by a column address selective signal 446 output from the column decoding circuit 424. In the case where the write circuit 449 receives the LOW-level WE signal 421, when the input data 419 is in the HIGH level, the HIGH and LOW levels are sent to the selected bit lines 447 and 448, through a first I/O line (common data line) 450 and a second I/O line 451, respectively. Likewise, when the input data 419 is in the LOW level, the LOW and HIGH levels are sent to the selected bit lines 447 and 448, respectively.

Figure 33:
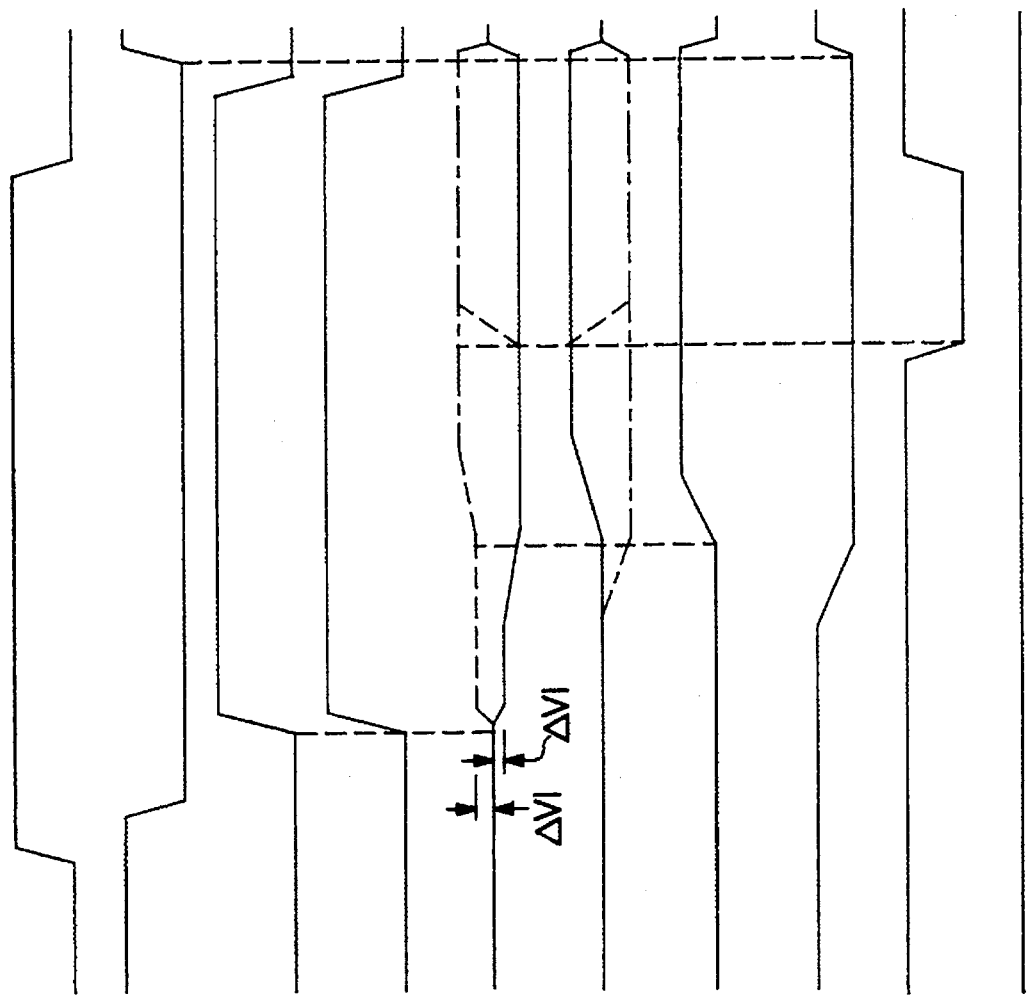
FIG. 33 is a timing chart showing the operation of the semiconductor memory device of FIG. 31.

Referring to FIG. 33, the timing of the operations of all the above circuits when the word line 430 is selected will be described. At this time, the least significant bit of the row address RA0 is in the LOW level and the second dummy word line 429 is activated. The solid lines of the waveforms (e) and (f) of the bit lines 447 and 448 are obtained when the data stored in the selected memory cell 434 is in the LOW level, while the dash lines of the waveforms thereof are obtained when the data is in the HIGH level.

When the RAS signal 416 is active at the timing of (a) of FIG. 33, the bit line precharge signal line 415 is activated (see (b)), and then the word line 430 and the second dummy word line 429 are activated (see (c) and (d)).

Figure 28:
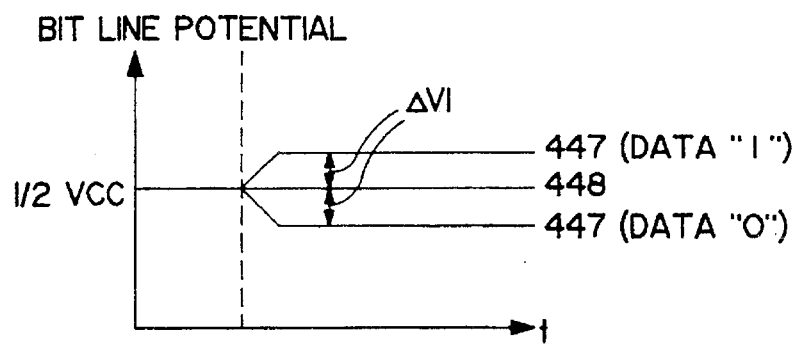
FIG. 28 is a graph showing the potential changes of a bit line of a conventional semiconductor memory device.
Figure 29:
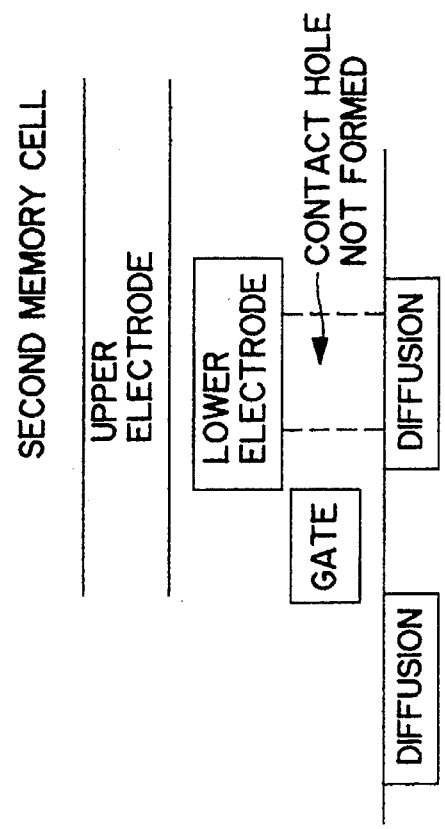
FIGS. 29a and 29b are sectional views showing the structures of the first memory cell and the second memory cell, respectively, of the semiconductor memory device according to the present invention.

Then, the NMOS sense amplifier drive signal line 413 is activated (see (h)), followed by the activation of the PMOS sense amplifier drive signal line 414 (see (g)). When the data of the selected memory cell 434 is "1" (HIGH level), the potential of the bit line 447 rises by ΔV1. When the data of the selected memory cell 434 is "0" (LOW level), the potential of the bit line 447 lowers by ΔV1. The value ΔV1 is determined by the division of the capacitances between the bit line 447 and the memory cell 434, which is expressed by the known equation of:

$$\Delta V1 = (\tfrac{1}{2}) \cdot Vcc \cdot \{CB \cdot CS/(CB+CS)\} \qquad (1)$$

wherein CS represents a capacitance of the memory cell, and CB represents a capacitance of the bit line. In the above case, the potential of the bit line 448 connected to the common sense amplifier 437 shared with the bit line 447 remains to be ½ Vcc, which can be used as the reference (see FIG. 28).

The data is written on the memory cell 434 during the period of time from when the WE signal 421 is lowered to the LOW level until when the WE signal 421 is raised to the HIGH level (see (i)). In the case when the data 419 input to the write circuit 449 is in the HIGH level (see (j)), the bit line 447 is raised to the HIGH level and the bit line 448 is lowered to the LOW level, as is shown by dot-dash lines in FIG. 33. Thus, the HIGH-level data is written on the selected memory cell 434.

If some memory cells of the above-described DRAM can be used for ROM, a semiconductor memory device having both a ROM and a RAM on a chip may be fabricated by almost the same process as that for fabricating the conventional DRAM. However, such a semiconductor memory device has not yet been realized. The present invention makes it possible to provide such a semiconductor memory device having both a ROM area and a RAM area on a chip as will be detailed in this and subsequent examples.

Referring to FIGS. 24a to 30, the function of the semiconductor memory device according to the present invention will be described. The semiconductor memory device used for this description has a plurality of bit lines and a plurality of word lines. The device comprises a first memory cell and a second memory cell. The first memory cell includes a first capacitor having a first terminal as a data memory node and a second terminal with a first standard potential. The first memory cell also includes a first switching transistor having a gate connected to each of the word lines, a source, and a drain. One of the source and the drain is connected to each of the bit lines and the other to the first terminal of the first capacitor. The second memory cell includes a second switching transistor having a gate connected to each of the word lines. The second memory cell also includes a second capacitor having no substantial electrical connection with the bit lines regardless of the word line being selected or not. The semiconductor memory device further includes a pre-charge element for precharging the bit line connected to the first memory cell or the second memory cell to a second standard potential independent from the first standard potential. The device further includes an initializing element for initializing the data memory node of the first capacitor to a third standard potential different from the second standard potential. In the read operation after the initialization by the initializing element, the potential of the bit line changes when the first memory cell is connected to the selected word line, and the potential of the bit line is kept unchanged when the second memory cell is connected to the selected word line.

In this semiconductor memory device, the data memory node of a first memory cell is initialized to a third standard potential which is different from a second standard potential and thereafter the stored data is read.

The power supply potential (Vcc) can be used for the second standard potential and the grounded potential (GND) can be used for the third potential. The first potential can be determined independent from the second and the third standard potentials. The middle level between the second and the third standard potentials, i.e., ½ Vcc can be used as the first potential.

A known dummy cell can be used as a means for changing the potential of the bit lines. Such a dummy cell should include a switching transistor and a capacitor as the first memory cell does. Moreover, the dummy cell should be able to store the ½ Vcc potential in the data memory node on receipt of a bit line precharge signal (see FIG. 24c).

First, the data memory node of the first memory cell is initialized to the third standard potential (GND potential). This initialization is effected by writing data "0" (GND potential) on the first memory cell in the same manner as in the case when data "0" is written on the conventional DRAM (see FIG. 24a). At this time, it is not necessary to write data "0" only on the selected first memory cells, but this writing of data "0" can be effected for all of the first memory cells and the second memory cells (see FIG. 24b).

Then, the bit line to which the first memory cell or the second memory cell is connected is pre-charged to the second standard potential. Simultaneously, the ½ Vcc potential is written on the data memory node of the dummy cell (see FIG. 24c).

Under the above-described conditions, when the first memory cell is selected by the word line, the data memory node of the first memory cell and the bit line are electrically connected. As a result, the potential of the bit line is lowered to the middle level between the precharged potential of the bit line (second standard potential) and the written potential of the data memory node of the first memory cell (third standard potential) due to the division of the capacitances between the bit line and the capacitor of the first memory cell.

Figure 26A:
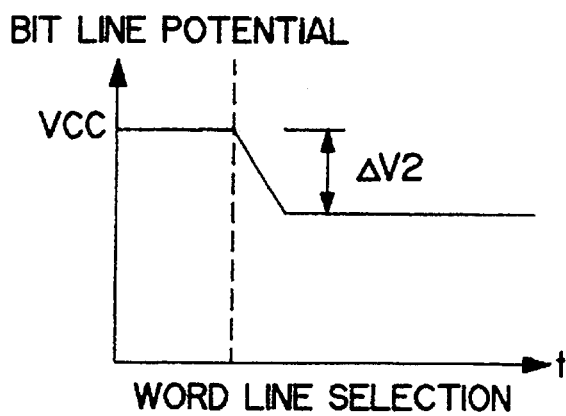
FIGS. 26a to 26d are graphs showing the potential changes of a bit line of the semiconductor memory device according to the present invention.

The potential change ΔV2 of the bit line at this time is determined by the division of the capacitances between the bit line and the memory cell, which is expressed by the equation:

$$V2 = Vcc \cdot \{CB \cdot CS/(CB+CS)\} \qquad (2)$$

wherein CS represents the capacitance of the memory cell, and CB represents the capacitance of the bit line (see FIG. 26a).

Figure 26B:
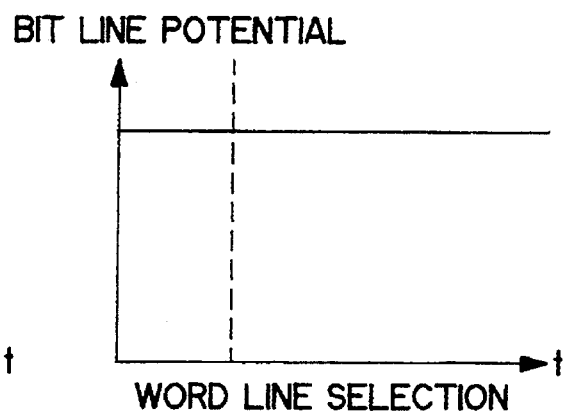
Figure 26C:
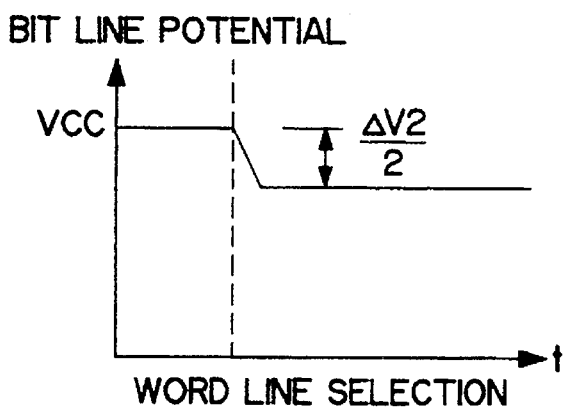
Figure 26D:
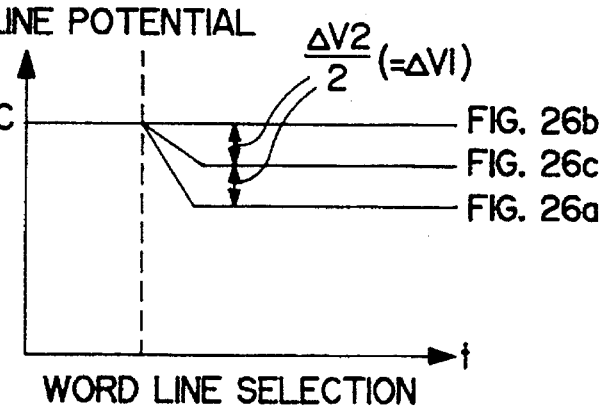

When the second memory cell is selected by the word line, since the data memory node of the second memory cell is not substantially electrically connected to the bit line, the bit line remains to have the precharged potential, i.e., the second standard potential (see FIG. 26b).

As described above, the potential of the bit line when the first memory cell is selected is different from that of the bit line when the second memory cell is selected. As a result, in the subsequent read operation, it is possible to distinguish the data stored in the first memory cell ("0" or "1") from that stored in the second memory cell (the other of "0" and "1"). Hereinafter, it is assumed that the data stored in the first memory cell is "0", and the data stored in the second memory cell is "1".

The dummy cell may be selected at the same time when the first or second memory cell is selected. At this time, the change of the potential of the bit line connected to the dummy cell is ΔV2/2 because the potential of ½ Vcc has been written on the data memory node of the dummy cell. Thus, by amplifying the potential difference between the bit line connected to the first or second memory cell and the bit line connected to the dummy cell (reference bit line) (See FIG. 26d), it is possible to distinguish the data stored in the first memory cell from that stored in the second memory cell.

The above-described first and second memory cells can be formed as separate components by the fabricating process of the semiconductor memory device. When the memory cell includes the switching transistor made of NMOS and the capacitor of a known stacked type, a contact hole for connecting a diffusion node of the NMOS transistor with the lower electrode of the capacitor can be formed for the first memory cell, and such a hole may not be formed for the second memory cell (see FIG. 28). Having the contact hole or not, i.e., "1" or "0" can be programmed by masking the contact hole as is done in a known mask programmable ROM.

Thus, according to the semiconductor memory cell of the present invention, it is possible to set the data in each memory cell to "1" or "0" by almost the same process as that for fabricating the DRAM known to the art. This makes it possible to use memory cells of the DRAM for a ROM.

If the area including both the first memory cells and the second memory cells, i.e., a ROM area is protected from writing of data from outside, the second standard potential written on the data memory node of the first memory cell in the initialization process will not be changed. This allows ROM data written on the ROM area to be kept unvolatile without being erased during the operation of the semiconductor memory device.

The above ROM area and an area composed of only the first memory cells and permitted to be written thereon, i.e., a RAM area, may be formed on the same substrate. This makes it possible to realize a semiconductor memory device having both the ROM areas and the RAM areas mixed thereon as schematically shown in FIG. 30.

Figure 25A:
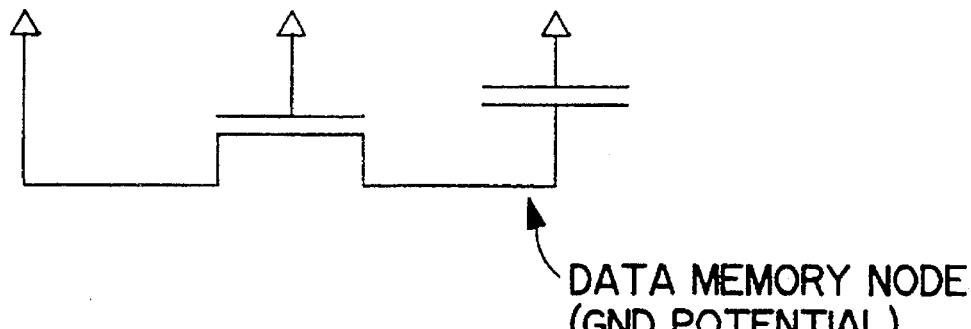
FIGS. 25a and 25b are circuit diagrams of a first memory cell having data "0" and data "1", respectively.
Figure 25B:
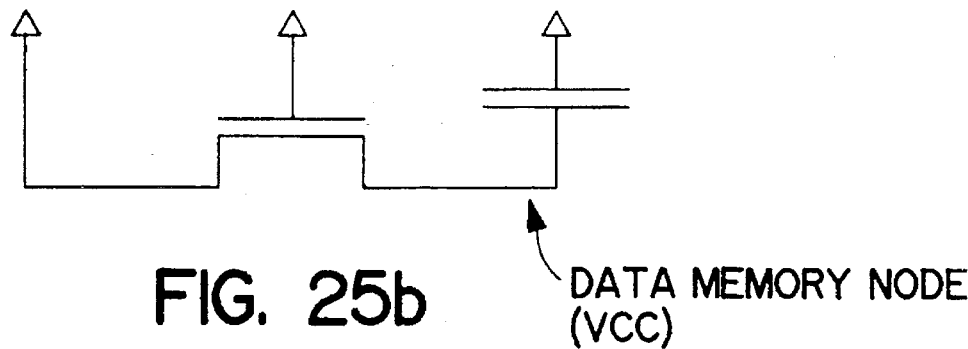

The read operations of the ROM area and the RAM area will be described. FIG. 25a shows the first memory cell when data "0" (GND potential) is written thereon as the data input from outside, and FIG. 25b shows the first memory cell when data "1" (Vcc potential) is written thereon as the data input from outside.

Figure 27:
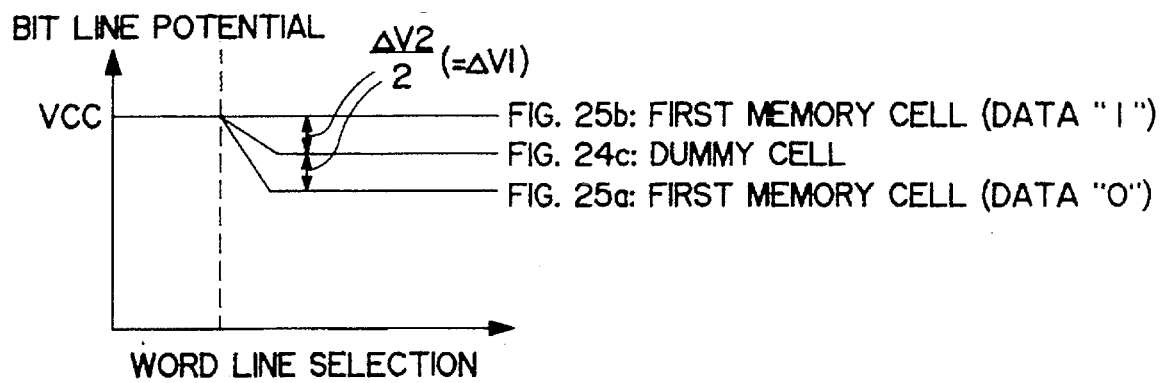
FIG. 27 is a graph showing the potential changes of a bit line when it selects a first memory cell having data "0" and data "1".

FIG. 27 shows the potential change of the bit line when the first memory cell having data "0" is selected. As is shown in FIG. 27, data "0" or "1" can be distinguished from each other by using the dummy cell shown in FIG. 24c. As is apparent from the comparison of FIG. 27 with FIG. 26d, the potential change of the bit line when the first memory cell having data "0" written thereon as the data input from outside (see FIG. 25a) is selected and that of the bit line when the first memory cell having data "0" written thereon as the initialized data (see FIG. 24a) is selected are the same.

Likewise, the potential change of the bit line when the first memory cell having data "1" written thereon as the data input from outside (see FIG. 25b) is selected and that of the bit line when the second memory (see FIG. 24b) is selected are the same. In other words, the RAM memory cell having data "0" written thereon (see FIG. 25a) and the ROM memory cell having data "0" written thereon (see FIG. 24a) are equivalent to each other in the read operation. Likewise, the RAM memory cell having data "1" written thereon (see FIG. 25b) and the ROM memory cell having data "1" written thereon (see FIG. 24b) are equivalent to each other in the reading operation.

Accordingly, the data in the ROM area and the RAM area can be read in the same procedure, so that it is not necessary to have different reading operations for the ROM area and the RAM area when they are connected to the same bit line. As a result, it is possible to have ROM memory cells and RAM memory cells mixed on the same bit line without complicating the structure of the semiconductor memory device.

Further, as is shown in FIG. 27, the potential difference between the bit line connected to the first memory cell or the second memory cell and the bit line connected to the dummy cell is $\Delta V2/2$. As is apparent from the above equations (1) and (2), this value equals to the potential difference $\Delta V1$ between the bit lines 447 and 448 shown in FIG. 28 as the conventional example. Thus, according to the semiconductor memory device of the present invention, by using a memory cell having a capacitor with the same capacitance as that used for the conventional DRAM, the potential difference to be read to the bit line can be the same as that in the conventional DRAM. As a result, it is possible to fabricate a semiconductor memory device having a ROM area and a RAM area mixed thereon by the same process as that for fabricating the conventional DRAM.

In the above case, the data memory node of the capacitor of the second memory cell is substantially disconnected from the bit line. This is electrically equivalent to using a third memory cell provided with a capacitor having a comparatively small or substantially zero capacitance. In other words, the second memory cell and the third memory cell are substantially equivalent in that sufficient charges can not be stored in the data memory node or in that charges are not sufficiently supplied to the bit line from the data memory node.

Now, the semiconductor memory device of this example according to the present invention will be described.

Figure 13:
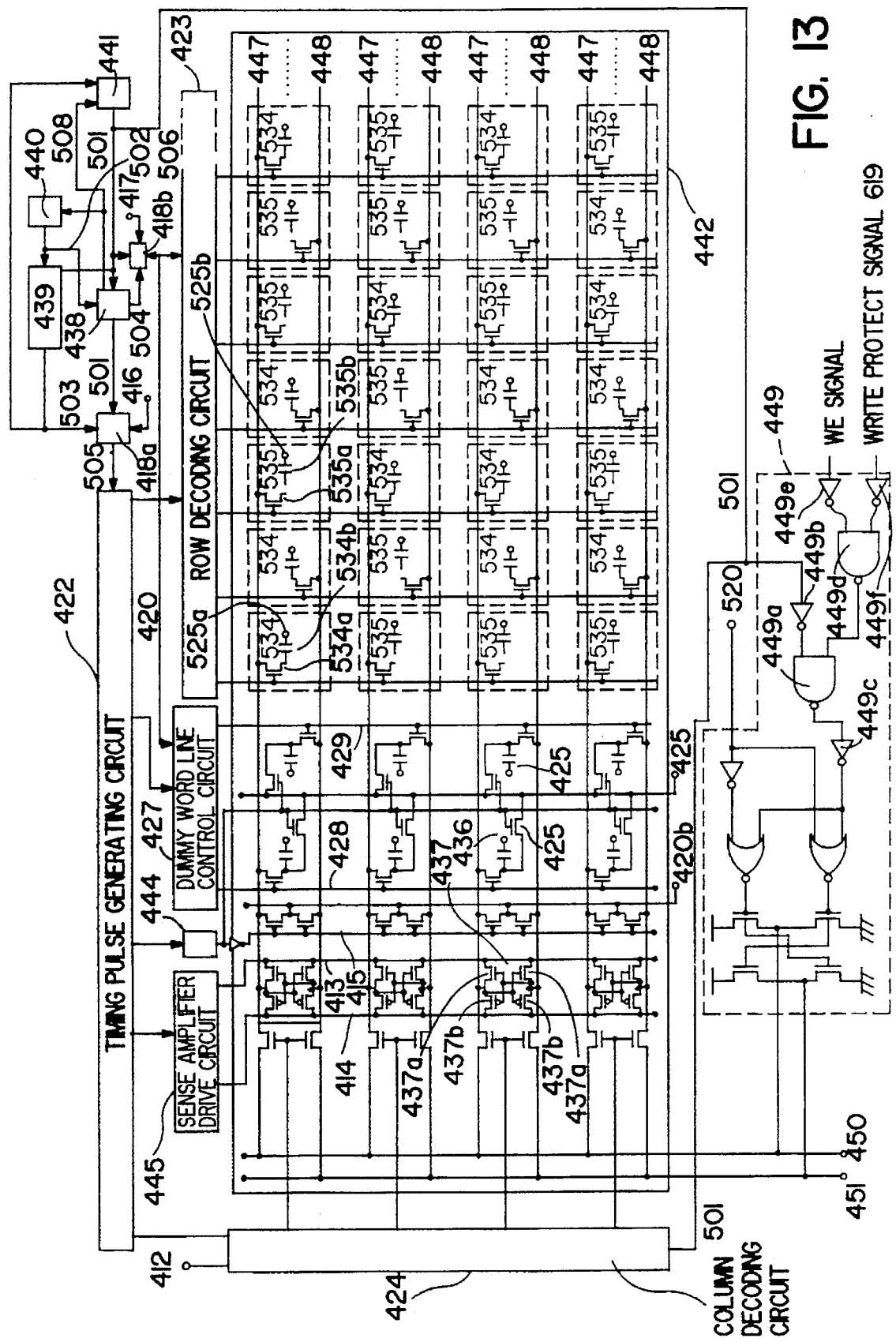
FIG. 13 is a circuit diagram of the main portion of the semiconductor memory device of an eighth example according to the present invention.
Figure 14:
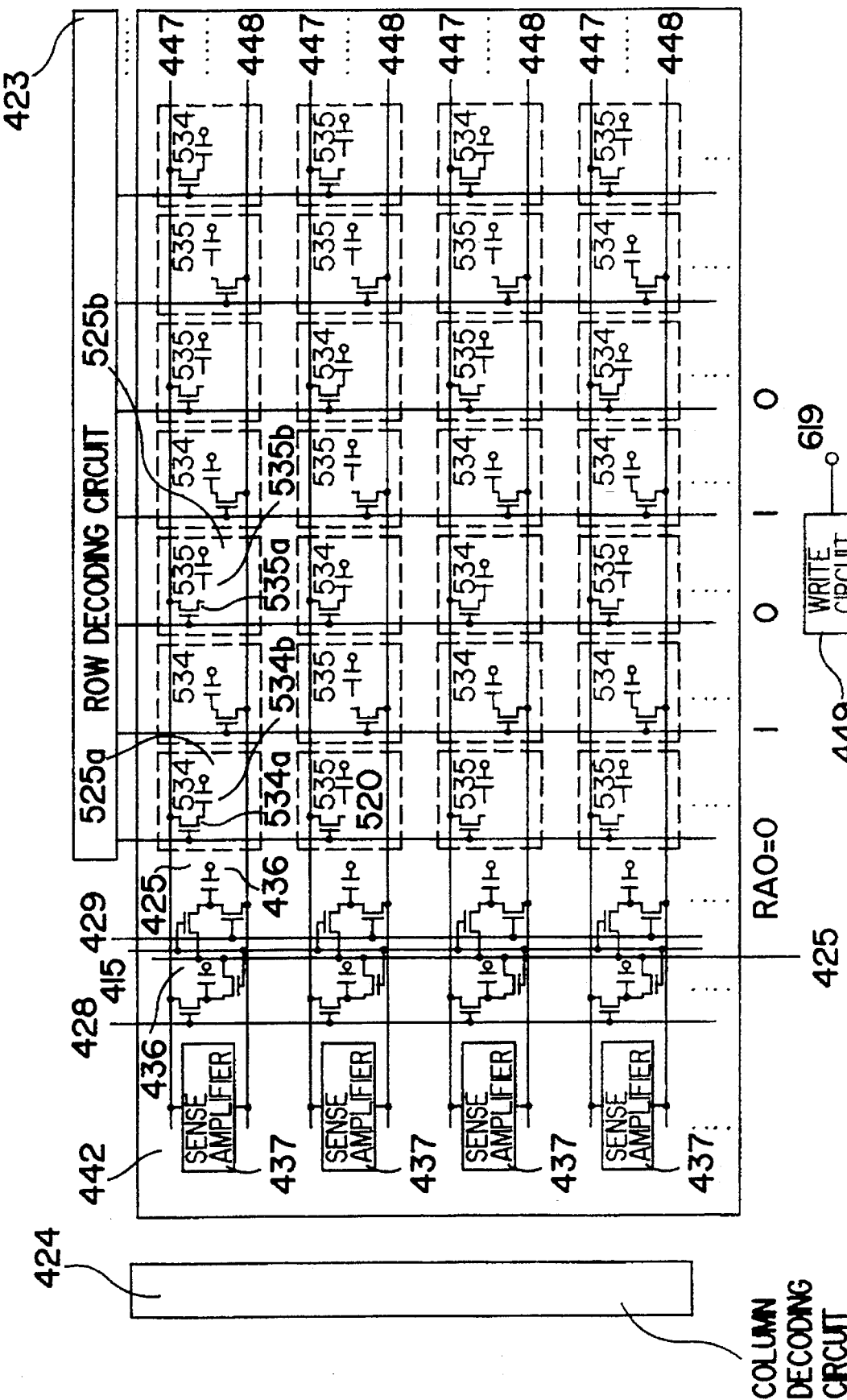
FIG. 14 is a circuit diagram of a memory block of the semiconductor memory device of FIG. 13 according to the present invention.

Referring to FIG. 13, the semiconductor memory device of this example uses the memory cells 434 of the conventional DRAM shown in FIG. 31 as ROM memory cells. FIG. 14 shows a practical arrangement of the memory block 442 of this example shown in FIG. 13. The circuit portions shown in FIG. 14 or the circuit portions shown in FIG. 13 except for the timing pulse generating circuit 422, first and second multiplexers 418a and 418b, a pseudo RAS signal generating circuit 439, a timer circuit 440, a row address counter 438, and a Vcc detecting circuit 441, can be included in the memory block 442.

Referring to FIGS. 13 and 14, first memory cells 534 and second memory cells 535 are arranged in the same memory block 442 in correspondence with the ROM data to be programmed. Thus, data "0" has been written on each of addresses corresponding to the first memory cells 534, and data "1" has been written on each of addresses corresponding to the second memory cells 535. In this example, the entire area of the memory block 442 is used for a ROM having the first memory cells 534 and the second memory cells 535 mixed thereon. Therefore, a write protect signal 619 transmitted to one of the input terminals of the write circuit 449 is fixed to the HIGH level, protecting the first and second memory cells 534 and 535 from writing, and thus keeping the data stored in the memory block 442 unvolatile.

As described above, the semiconductor memory device of this example is different from the conventional DRAM shown in FIG. 31 in using the memory cells of the DRAM for a ROM. Many of the circuit components shown in FIG. 13 are the same as those shown in FIG. 31. Therefore, like components are denoted by like numerals, and only different components will be described.

Each of the first memory cells 534 includes a transistor 534a and a capacitor 534b, both of which are the same as the transistor 434a and the capacitor 434b of the memory cell 434 shown in FIG. 31. Each of the second memory cells 535 includes a transistor 535a and a capacitor 535b. The transistor 535a is the same as the transistor 534a and the transistor 434a, but the transistor 535a is not electrically connected to the capacitor 535b.

Second terminals 525a of the capacitors 534b of the first memory cells 534 share a common cell plate having a potential of ½ Vcc as in the conventional DRAM. Likewise, second terminals 525b of the capacitors 535b of the second memory cells 535 share a common cell plate having a potential of ½ Vcc.

As defined hereinbefore, the first standard potential refers to ½ Vcc, the second standard potential refers to Vcc, and the third standard potential refers to the GND potential. The first standard potential can be selected independent from the second and third standard potentials. However, in this example, to reduce the voltage across an insulating film of the capacitor 534b or 535b, the first standard potential is set to the middle level between the Vcc and GND potentials, i.e., ½ Vcc.

The semiconductor memory device of this example further includes an initializing element for initializing the data memory node of each of the first memory cells 534 connected to the bit lines 447 (or the data memory node of each of the first memory cells 534 connected to the bit lines 448) to the third standard potential. The read operation is effected after the initialization process has been automatically performed.

The first and the second dummy cells 436a and 436b of this example have an additional function besides the function of canceling a noise as described above. That is, the first or second dummy cell 436a or 436b provides the middle level of the potential between the potential read from the first memory cell 534 to the bit line 447 (or 448) when the first memory cell 534 is selected and the potential read from the second memory cell 535 to the bit line 447 (or 448) when the second memory cell 535 is selected, to the counterpart-bit line 448 (or 447). In short, the counterpart bit line 448 (or 447) operates as the reference for the bit line 447 (or 448) connected to the first or second memory cell 534 or 535.

Then, the structure and the operation of the initializing element will be described. When the power is switched on, the Vcc detecting circuit 441 detects the boosting of Vcc and outputs a HIGH-level signal to a signal line 501. When the initialization process terminates, the Vcc detecting circuit 441 receives an initialization end signal 508 indicating the termination of the initialization from the row address counter 438. On receipt of the initialization end signal 508, the Vcc detecting circuit 441 outputs a LOW-level signal to the signal line 501.

The first and second multiplexers 418a and 418b are connected to the signal line 501. When the signal line 501 is lowered to the LOW level on receipt of the LOW-level signal from the Vcc detecting circuit 441, the first multiplexer 418a receives a RAS signal 416 from outside and outputs it to a signal line 505 connected to the timing pulse generating circuit 422. The second multiplexer 418b receives a row address signal 417 including the least significant bit of the row address RA0 (420) from outside and outputs it to a signal line 506 connected to the row decoding circuit 423.

When the signal line 501 is raised to the HIGH level, the first multiplexer 418a receives a pseudo RAS signal 503 from the pseudo RAS signal generating circuit 439 and outputs it to the signal line 505. The second multiplexer 418b receives a row address signal 504 from the row address counter 438 and outputs it to the signal line 506.

The timer circuit 440 is connected to the pseudo RAS signal generating circuit 439. When the signal line 501 is in the HIGH level, the timer circuit 440 outputs a pulse signal 502 having a constant frequency to the pseudo RAS signal generating circuit 439. On receipt of the pulse signal 502, the pseudo RAS signal generating circuit 439 outputs the pseudo RAS signal 503 in a constant period, which is fed to the signal line 505 through the first multiplexer 418a as mentioned above.

The pulse signal 502 is also fed to the row address counter 438. On receipt of the pulse signal 502, the row address counter 438 adds the number of bits of the row address one by one by incremental counting, and outputs the row address signal 504 to the signal line 506 through the second multiplexer 418b in a constant period. When one cycle of the incremental counting terminates, the row address counter 438 outputs the initialization end signal 508 to the Vcc detecting circuit 441 to indicate the termination of the initialization process. The row address counter 438 resets the row address to 0 when the signal line 501 is raised to the HIGH level.

The signal line 501 is also connected to the column decoding circuit 424. When the signal line 501 is in the LOW level, the column decoding circuit 424 operates as described in the above conventional DRAM. However, when the signal line 501 is in the HIGH level, the column decoding circuit 424 raises all the column address selective signals 446 to the HIGH level before any of the word lines 430, 431, 432, . . . is activated. As a result, all the bit lines 447 and 448 are connected to the first and the second I/O lines 450 and 451.

The write circuit 449 of this example includes NAND gates 449a and 449d and inverters 449b, 449c, 449e, and 449f. The inverters 449b and 449c are connected to one of the input terminals and the output terminal of the NAND gate 449a, respectively. The other input terminal of the NAND gate 449a is connected to the output terminal of the NAND gate 449d, of which input terminals are connected to the inverters 449e and 449f. The write circuit 449 operates as a part of the initializing element as described below.

The signal line 501 is connected to the input terminal of the inverter 449b. When the signal line 501 is in the HIGH level, the write circuit 449 sends the HIGH or LOW level to the bit lines 447 and 448 through the I/O lines 450 and 451 in accordance with the level of the least significant bit of the row address RA0. More specifically, when RA0 is in the LOW level, the LOW level is sent to the bit line 447 and the HIGH level to the bit line 448. When RA0 is in the HIGH level, the HIGH level is sent to the bit line 447 and the LOW level to the bit line 448.

When RA0 is in the LOW level, the word line 430 or 432 is raised to the HIGH level, so that the LOW level is written on the selected memory cell. On the other hand, when RA0 is in the HIGH level, the word line 431 or 433 is raised to the HIGH level, so that the LOW level is written on the selected memory cell.

Figure 15:
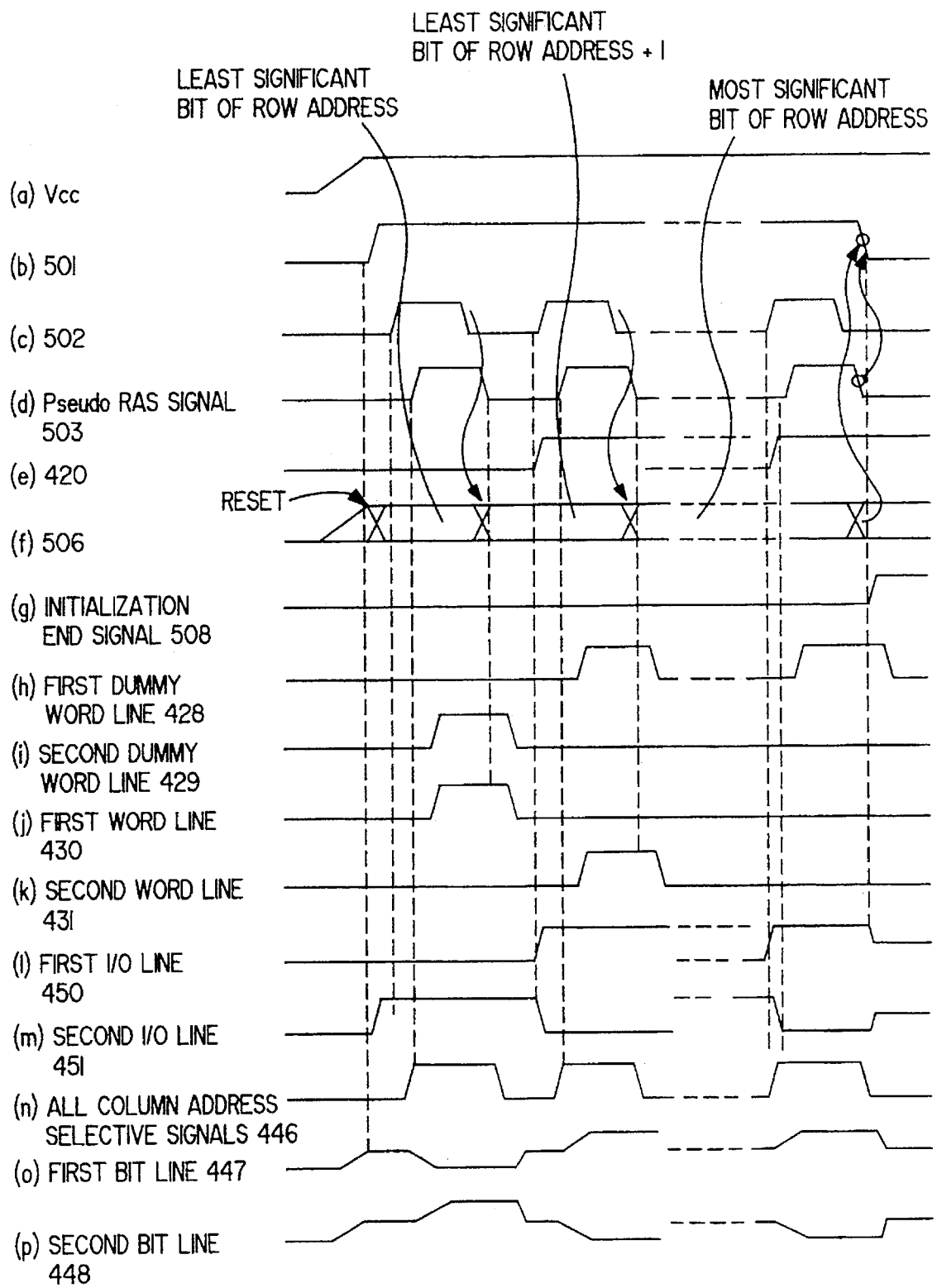
FIG. 15 is a timing chart showing the initialization process performed by the semiconductor memory device of FIG. 13 according to the present invention.

Next, referring to FIG. 15, the timing of the initialization effected by the initializing element composed of the above described circuit components will be described. In FIG. 15, the word line 430 (first word line) (see (j)) corresponds to the least significant bit of the row address and the word line 431 (second word line) (see (k)) corresponds to the least significant bit of the row address plus one.

Referring to FIG. 15, when the power is turned on and the Vcc detecting circuit 441 detects the boosting of Vcc at the timing of (a), the Vcc detecting circuit 441 raises the signal line 501 to the HIGH level at the timing of (b). When the signal line 501 is raised to the HIGH level, the timer circuit 440 outputs the pulse signal 502 having a waveform of (c) to the pseudo RAS signal generating circuit 439. Then, the pseudo RAS signal generating circuit 439 outputs the pseudo RAS signal 503 having a waveform of (d) to the first multiplexer 418a. The first multiplexer 418a sends the pseudo RAS signal 503 to the timing pulse generating circuit 422 through the signal line 505 when the signal line 501 is in the HIGH level. The row address counter 438 resets the row address to 0 when the signal line 501 is raised to the HIGH level (see (f)).

When the signal line 501 is in the HIGH level, the row address counter 438 receives the pulse signal 502 from the timer circuit 440 and outputs the row address signal 504 to the second multiplexer 418b. The second multiplexer 418b outputs the least significant bit of the row address RA0 (420) (see (e)) to the dummy word line control circuit 427. The waveform of (f) shows the incremental counting of the row address by the row address counter 438.

When the cycle of the incremental counting terminates, the row address counter 438 outputs the initialization end signal 508 having a waveform of (g) to the Vcc detecting circuit 441. When the Vcc detecting circuit 441 receives the HIGH-level initialization end signal 508 and the LOW-level pseudo RAS signal 503 sent when the initialization of the most significant bit of the row address terminates (see (g), (d), and (a)), it lowers the signal line 501 to the LOW level (see (b)), thus to complete the initialization process.

During the above initialization process, when the timing pulse generating circuit 422 receives the pseudo RAS signal 503 from the first multiplexer 418a, it outputs pulse signals for control to the sense amplifier drive circuit 445, the bit line precharge signal generating circuit 444, the dummy word line control circuit 427, the row decoding circuit 423, and the column decoding circuit 424. As a result, the first dummy word line 428, the second dummy word line 429, the first word line 430, the second word line 431, the first I/O line 450, the second I/O line 451, and the column address selective signal 446 are raised to the HIGH level at the timings of (h) to (n), respectively.

At this time, as is seen by comparing (o) and (p) with (j) and (k), the bit lines 447 and 448 have been almost activated prior to the activation of the word lines 430 and 431. Therefore, regardless of the level of the data stored in the memory cell immediately after the boosting of Vcc, the LOW-level (GND potential) data will be written on the data memory node of the capacitor 534b of the first memory cell 534.

Figure 16:
FIG. 16 is a timing chart showing the operation of the semiconductor memory device of FIG. 13 according to the present invention.

Next, referring to FIG. 16, the read operation of the semiconductor memory device of this example will be described. In this example, the word line 430 or 432 is selected (see (c)), the least significant bit of the row address RA0 is in the LOW level ("0"), and the second dummy word line 429 is selected. In accordance with the selection of the second dummy word line 429, the potential of the bit line 448 as the reference bit line changes (see (f)).

When the first memory cell 534 is selected through the selection of the word line 430, the potentials of the bit lines 447 and 448 change as shown by the solid lines in (e) and (f), respectively, so that the LOW level is read to the bit line 447 connected to the first memory cell 534. On the other hand, when the second memory cell 535 is selected through the selection of the word line 432, the potentials of the bit lines 447 and 448 change as shown by the dash lines in (e) and (f), respectively, so that the HIGH level is read to the bit line 447 connected to the second memory cell 535. The waveforms of (a), (b), (g), and (h) show the RAS signal 416, the bit line precharge signal line 415, the PMOS sense amplifier drive signal line 414, and the NMOS sense amplifier drive signal line 413 at the rewrite operation, respectively.

The above initialization and the subsequent read operation will be described in more detail. First, the bit line precharge signal generating circuit 444 precharges the bit line 447 or 448 connected to the first memory cell 534 or the second memory cell 535 to the second standard potential, Vcc. Under this condition, when the first memory cell 534 is selected through the activation of the word line 430, the data memory node of the capacitor 534b of the first memory cell 534 is electrically connected to the bit line 447 or 448. At this time, the bit line 447 or 448 is lowered to the middle level of the potential between the precharged Vcc potential of the bit line 447 or 448 and the GND potential written on the data memory node of the capacitor 534b of the first memory cell 534, due to the division of the capacitances between the bit line 447 or 448 and the capacitor 534b of the first memory cell 534. The potential change ΔV2 of the bit line 447 or 448 at this time is expressed by the above equation (2).

On the other hand, when the second memory cell 535 is selected through the activation of the word line 432, the data memory node of the capacitor 535b of the second memory cell 535 is not substantially electrically connected to the bit line 447 or 448. Thus, the precharged Vcc potential of the bit line 447 or 448 is retained.

Thus, according to this example, The potential of the bit line 447 or 448 when the first memory cell 534 is selected is different from that when the second memory cell 535 is selected. This makes it possible to distinguish the data stored in the first memory cell 534 as "0" from the data stored in the second memory cell 535 as "1" in the subsequent read operation.

Further, the potential of the bit line 448 as the reference bit line changes as shown in (f) by the selection of the second dummy word line 429. Accordingly, as shown in (e) and (f), the data "0" or "1" can be read by amplifying the potential difference between the bit lines 447 and 448.

The first memory cells 534 and the second memory cells 535 can be formed as separate components by mask patterning as stated earlier. Thus, according to the semiconductor memory device of this example, it is possible to fix the data in the memory cells to be "0" or "1" in the process similar to that for fabricating the DRAM known to the art, and thus to use the memory cells of the DRAM for the ROM.

Further, according to the semiconductor memory device of this example, the write protect signal 619 input to the write circuit 449 is fixed to the HIGH level for the ROM area having both the first memory cells 534 and the second memory cells 535 mixed thereon. Accordingly, even when the WE signal 421 (active LOW) is in the LOW level (write enable state), the data 520 from outside is not sent to the I/O lines 450 and 451. As a result, the second standard potential (GND potential) written on the data memory node of the capacitor 534b of the first memory cell 534 by the initializing element can be retained, allowing the ROM data to be kept unvolatile during the operation of the semiconductor memory device.

In the conventional semiconductor memory device, the WE signal 421 input to the write circuit 449 which is active when it is in the LOW level is a signal generated from an outside circuit to instruct writing. On the other hand, in the semiconductor memory device of this example, the write protect signal 619 is input to the write circuit 449 in addition to the WE signal 421. In the case that the write protect signal 619 input to the inverter 449f is in the LOW level, the data writing is effected when the WE signal 421 is in the LOW level as in the conventional semiconductor memory device. However, in the case that the write protect signal 619 is in the HIGH level, the data writing is not effected even when the WE signal 421 is in the LOW level. In this case, the data writing is effected only when the signal line 501 is raised to the HIGH level at the initialization process.

According to the write circuit 449 having the above-described structure, the ROM area is effectively protected from writing, so that the data written on the first memory cell 534 in the initialization process can be protected. Thus, in case that the CPU was to runaway and as a result a wrong write instruction was sent for the ROM area, the ROM data can be protected from being erased.

In this example, the transistor 535a and the capacitor 535b of the second memory cell 535 have not been electrically connected. However, any circuit electrically equivalent to the above structure can also be used for the present invention. For example, a capacitor having a comparatively small or substantially zero capacitance can be connected to the transistor 535a. The first and second bi-directional terminals of the transistor 535a may not be electrically connected to each other at any time regardless of the potential of the control terminal. The first bi-directional terminal of the transistor 535a may not be electrically connected to the bit line 447 (or 448). Otherwise, the second memory cell 535 may not have the transistor 535a nor the capacitor 535b.

Figure 17A:
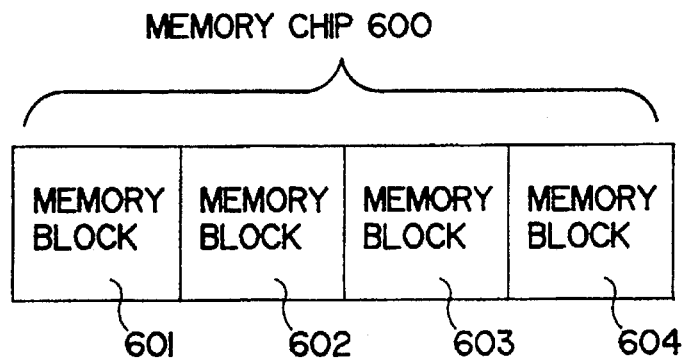
FIG. 17a shows an outlined structure of a memory chip of an alteration of the eighth example according to the present invention.
Figure 17B:
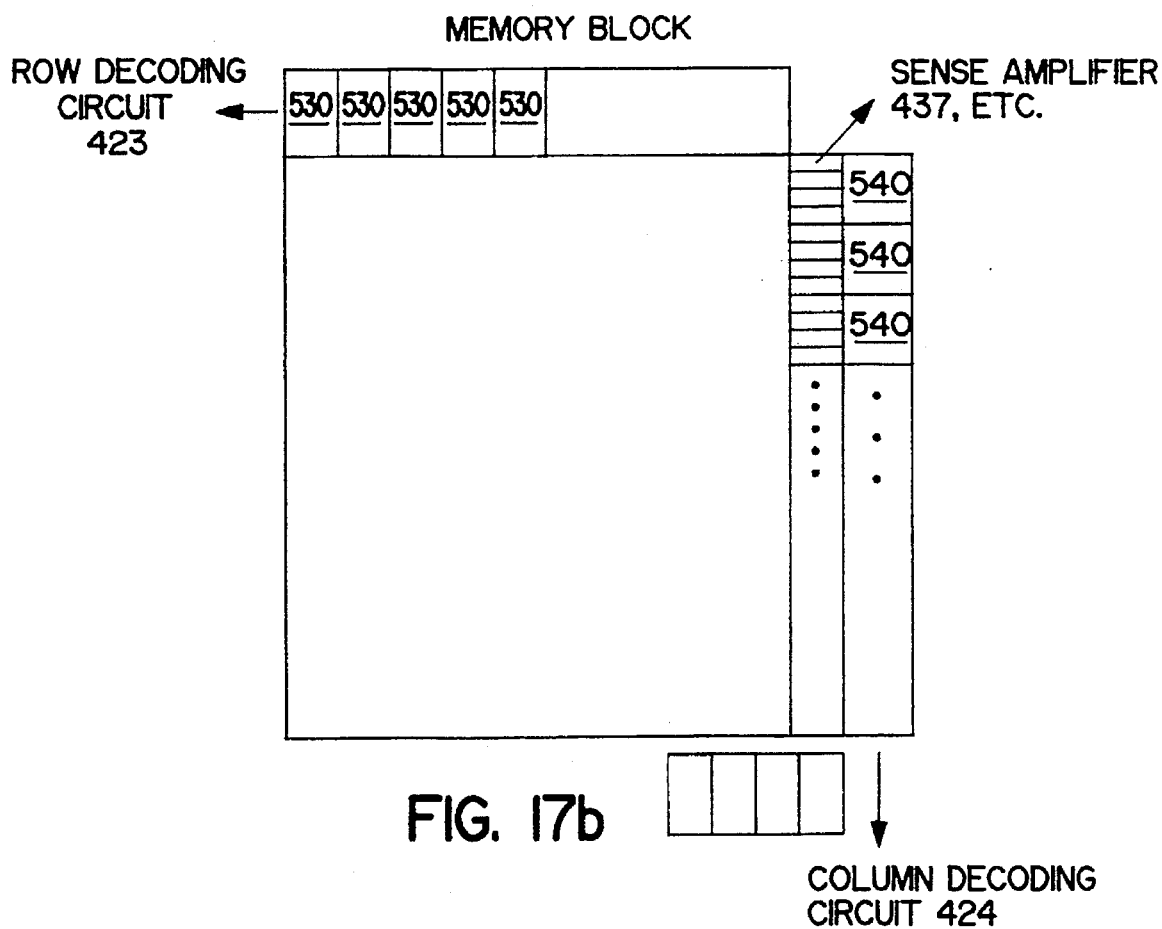
Figure 18:
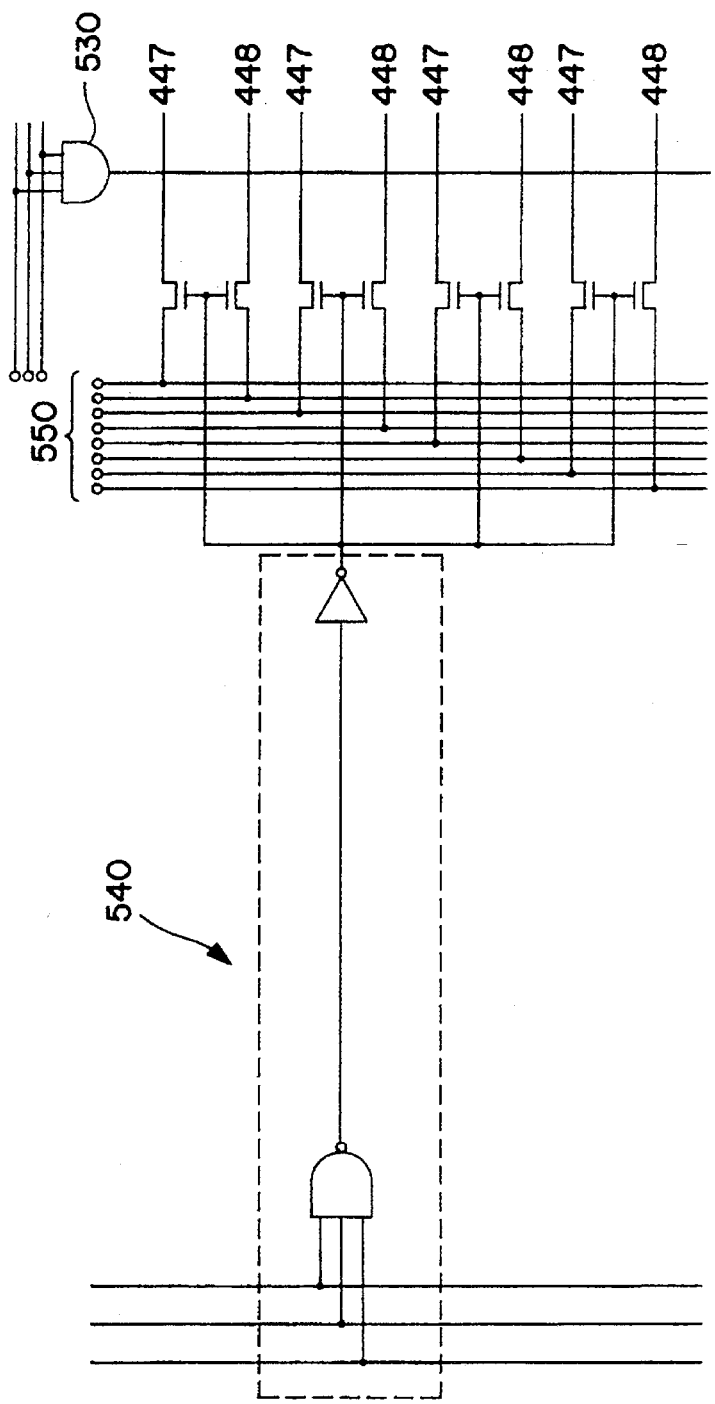
FIG. 18 is a view showing the memory block of FIG. 17b in more detail.

Further, in this example, one pair of the I/O lines 450 and 451 are used as the data lines as is shown in FIG. 13. However, two or more pairs of data lines can also be used as data buses. Such data lines are shown in FIGS. 17a, 17b, and 18. The semiconductor memory device shown in FIG. 23 which will be described later also includes such data lines.

FIG. 17a schematically shows the entire structure of a memory chip 600 including memory blocks 601, 602, 603, and 604. FIG. 17b is an enlarged schematic view of one of the above memory blocks. FIG. 18 shows details of the memory block shown in FIG. 17b. Each of the memory blocks 601 to 604 includes four pairs of bit lines 447 and 448 which constitute one column address. According to this circuit structure, the row address is sent to the row decoding circuit 423 from row address buffers 530, and the column address is sent to the column decoding circuit 424 from column address buffers 540, to designate a particular row address and a particular column address. Thus, four-bit data is written or read through a plurality of data lines 550.

EXAMPLE 9

Figure 19:
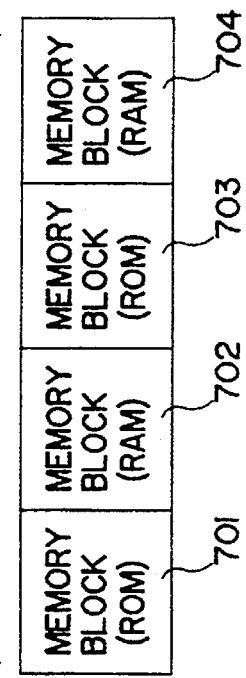
FIG. 19 shows an outlined structure of the memory chip of the semiconductor memory device of a ninth example according to the present invention.

FIG. 19 schematically shows a memory chip 700 of the semiconductor memory device of this example. In this example, the memory chip 700 includes four memory blocks 701, 702, 703, and 704. The memory blocks 701 and 703 includes the first memory cells 534 and the second memory cells 535, while the memory blocks 702 and 704 includes only the first memory cells 534 as in the conventional DRAM.

Accordingly, the memory blocks 701 and 703 which are to be ROM areas are protected from writing except for the writing in the initialization process. This can be achieved by fixing the write protect signal 619 to the HIGH level for the memory blocks 701 and 703. On the other hand, writing is permitted for the memory blocks 702 and 704 which are to be RAM areas. This can be achieved by fixing the write protect signal 619 to the LOW level for the memory blocks 702 and 704.

Thus, according to the semiconductor memory device of this example, the ROM areas and the RAM areas can be flexibly defined by each memory block on the memory chip 700.

EXAMPLE 10

Figure 20:
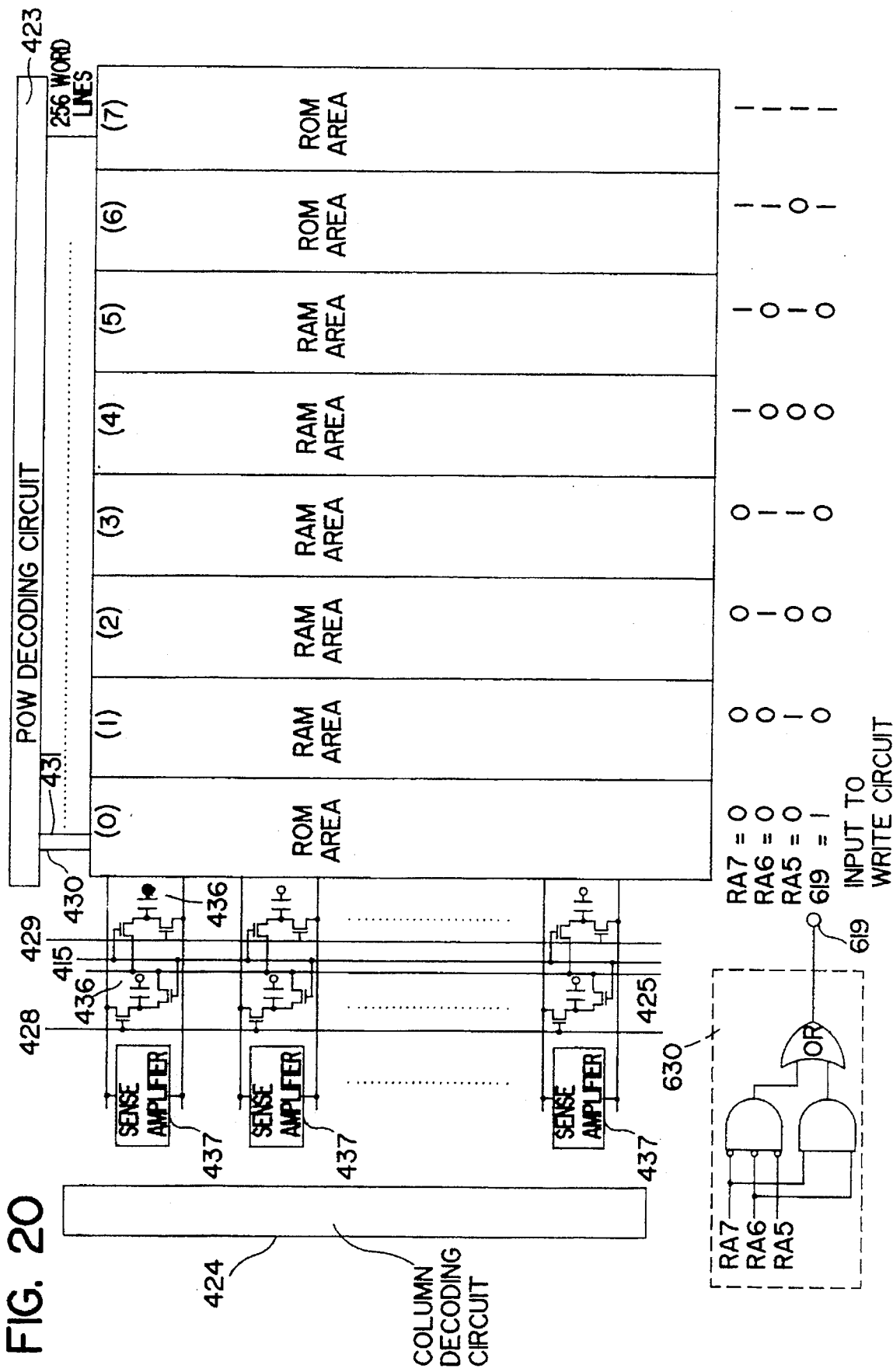
FIG. 20 is a schematic view showing the main portion of the semiconductor memory device of a tenth example according to the present invention.

FIG. 20 shows the semiconductor memory device of this example according to the present invention. In this example, a memory chip includes a memory block divided into eight areas (0) to (7). Each of these areas can be either a ROM area having both the first memory cells 534 and the second memory cells 535 mixed thereon or a RAM area having only the first memory cells 534. In this example, the areas (0), (6), and (7) are set to be ROM areas and areas (1) to (5) are set to be RAM areas.

According to the above setting, the areas (0), (6), and (7) are write protected and the areas (1) to (5) are write permitted. To achieve this, the semiconductor memory device of this example is provided with a second row decoding circuit 630 so as to supply the write protect signal 619 to the write circuit 449. When any of the ROM areas (0), (6), and (7) is selected by decoding the row addresses RA5, RA6, and RA7. The second row decoding circuit 630 outputs a HIGH-level signal to one of the input terminals of the write circuit 449. On the other hand, the second row decoding circuit 630 outputs a LOW-level signal when any of the areas (1) to (5) is selected.

With the above-described structure, the HIGH level ("1") or the LOW level ("0") of the write protect signal 619 is set for each combination of the row addresses RA5, RA6, and RA7 as is shown in FIG. 20. Thus, the write protect ROM areas and the write permit RAM areas can be formed on each memory block.

EXAMPLE 11

Figure 21:
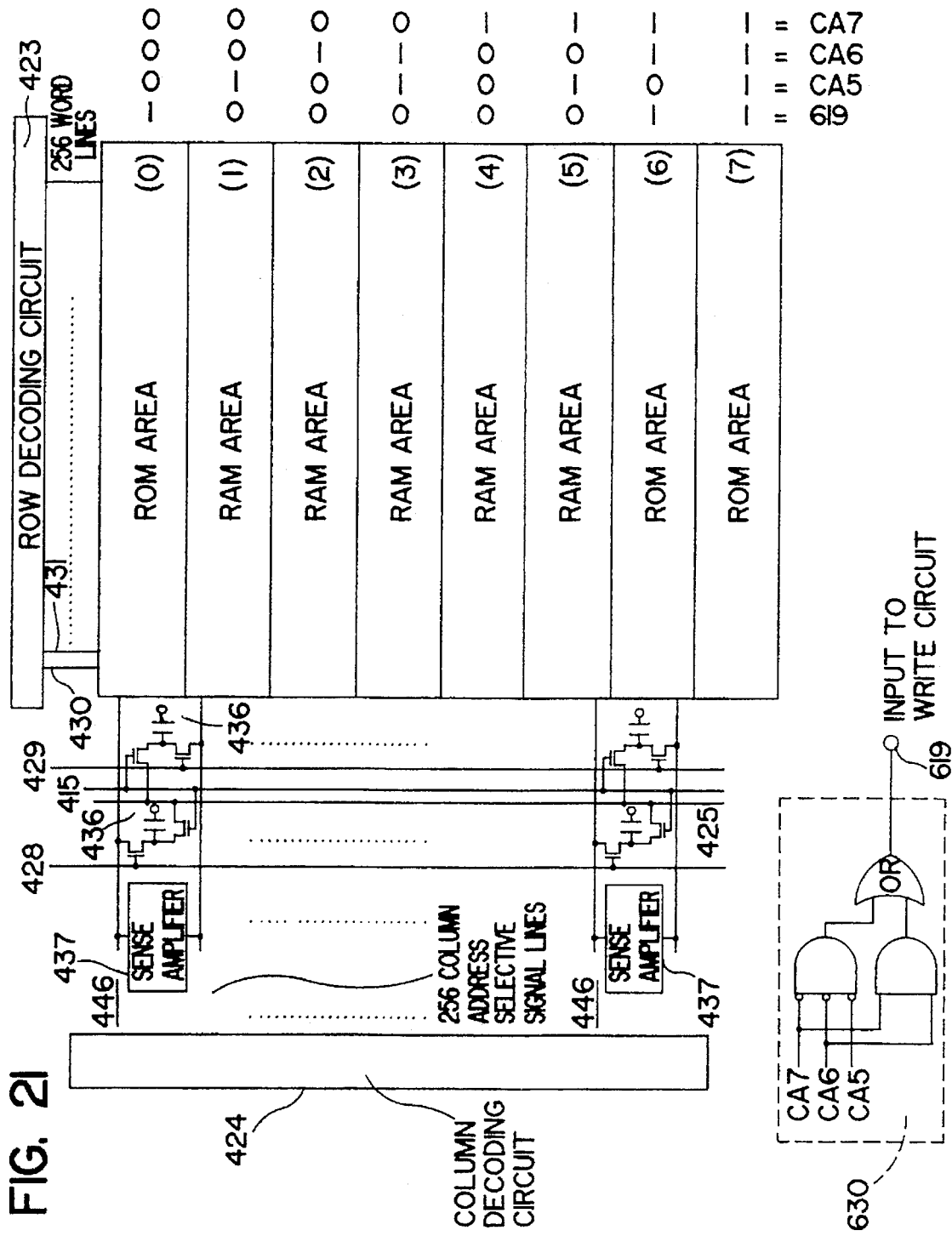
FIG. 21 is a schematic view showing the main portion of the semiconductor memory device of an eleventh example according to the present invention.

FIG. 21 shows the semiconductor memory device of this example according to the present invention. In this example, a memory chip includes a memory block divided into eight areas (0) to (7). Each of these areas can be either a ROM area having both the first memory cells 534 and the second memory cells 535 mixed thereon or a RAM area having only the first memory cells 534. In this example, as in Example 10, the areas (0), (6), and (7) are set to be ROM areas and areas (1) to (5) are set to be RAM areas.

In this example, the column decoding circuit 424 outputs total 256 (=$2^8$) column address selective signals 446, which are selected by decoding the column addresses CA0 to CA7. In other words, one of the column address selective signals 446 is selected by this decoding.

The above areas (0) to (7) are determined by the three more significant bits of the column addresses CA5, CA6, and CA7. The semiconductor memory device of this example is provided with a second column decoding circuit 640 having the same circuit structure as the second row decoding circuit 630 so as to supply the write protect signal 619 to the write circuit 449. When any of the ROM areas (0), (6), and (7) is selected by decoding the column addresses CA5, CA6, and CA7, the second column decoding circuit 640 outputs a HIGH-level signal to one of the input terminals of the write circuit 449. On the other hand, the second column decoding circuit 640 outputs a LOW-level signal when any of the areas (1) to (5) is selected.

With the above-described structure, the HIGH level ("1") or the LOW level ("0") of the write protect signal 619 is set for each combination of the column addresses CA5, CA6, and CA7 as is shown in FIG. 21. Thus, the write protect ROM areas and the write permit RAM areas can be formed on each memory block.

EXAMPLE 12

Figure 22:
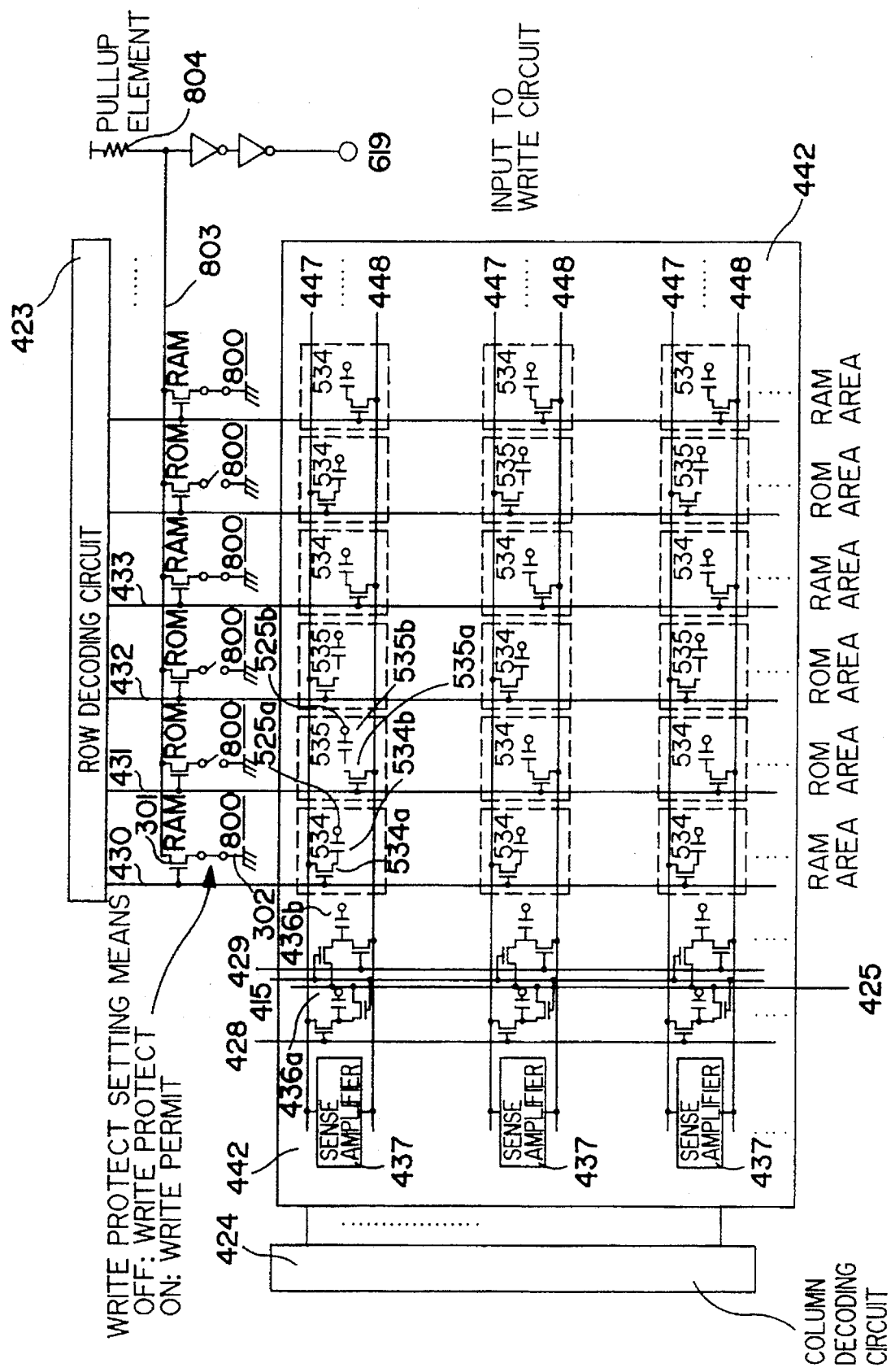
FIG. 22 is a schematic view showing the main portion of the semiconductor memory device of a twelfth example according to the present invention.

FIG. 22 shows the semiconductor memory device of this example according to the present invention. In this example, a memory block has ROM areas and RAM areas which can be defined by each raw address (word line). To achieve this, a write protect detection element 800 is disposed for each of the word lines 430, 431, 432, 433, . . . . The write protect detection element 800 which includes an NMOS transistor 801 and a switching element 802 is operated as follows.

When a particular word line (row address) is desired to be a RAM area, the switching element 802 of the write protect detection element 800 corresponding to the particular word line is set to the ON state (low impedance) previously in the fabricating process of the semiconductor memory device. Under this state, when this particular word line is selected and raised to the HIGH level, a signal line 803 is lowered to the LOW level through the write protect detection element 800. This results in that the LOW-level write protect signal 619 is sent to one of the input terminals of the write circuit 449. Thus, when the WE signal 421 is input to the other input terminal of the write circuit 449, data is output from the write circuit 449 to be written on memory cells connected to the particular word line.

On the other hand, when a particular word line is desired to be a ROM area, the switching element 802 of the write protect detection element 800 corresponding to the particular word line is set to the OFF state (high impedance state) previously in the fabricating process of the semiconductor memory device. Under this state, even when this particular word line is selected and raised to the HIGH level, the signal line 803 keeps the HIGH level through a pullup element (pullup resistance) 804. This results in that the HIGH-level write protect signal 619 is sent to one of the input terminals of the write circuit 449. Thus, regardless of the level of the WE signal 421 sent to the other input terminal of the write circuit 449, memory cells connected to the particular word line are protected from writing, and the data written thereon in the initialization process is kept unvolatile.

The switching element 802 can be easily set to the ON or OFF state in the fabricating process of the semiconductor memory device by forming an interconnection, a contact, or the like or not, and this setting can be programmed by patterning a mask for the connection or the contact.

EXAMPLE 13

Figure 23:
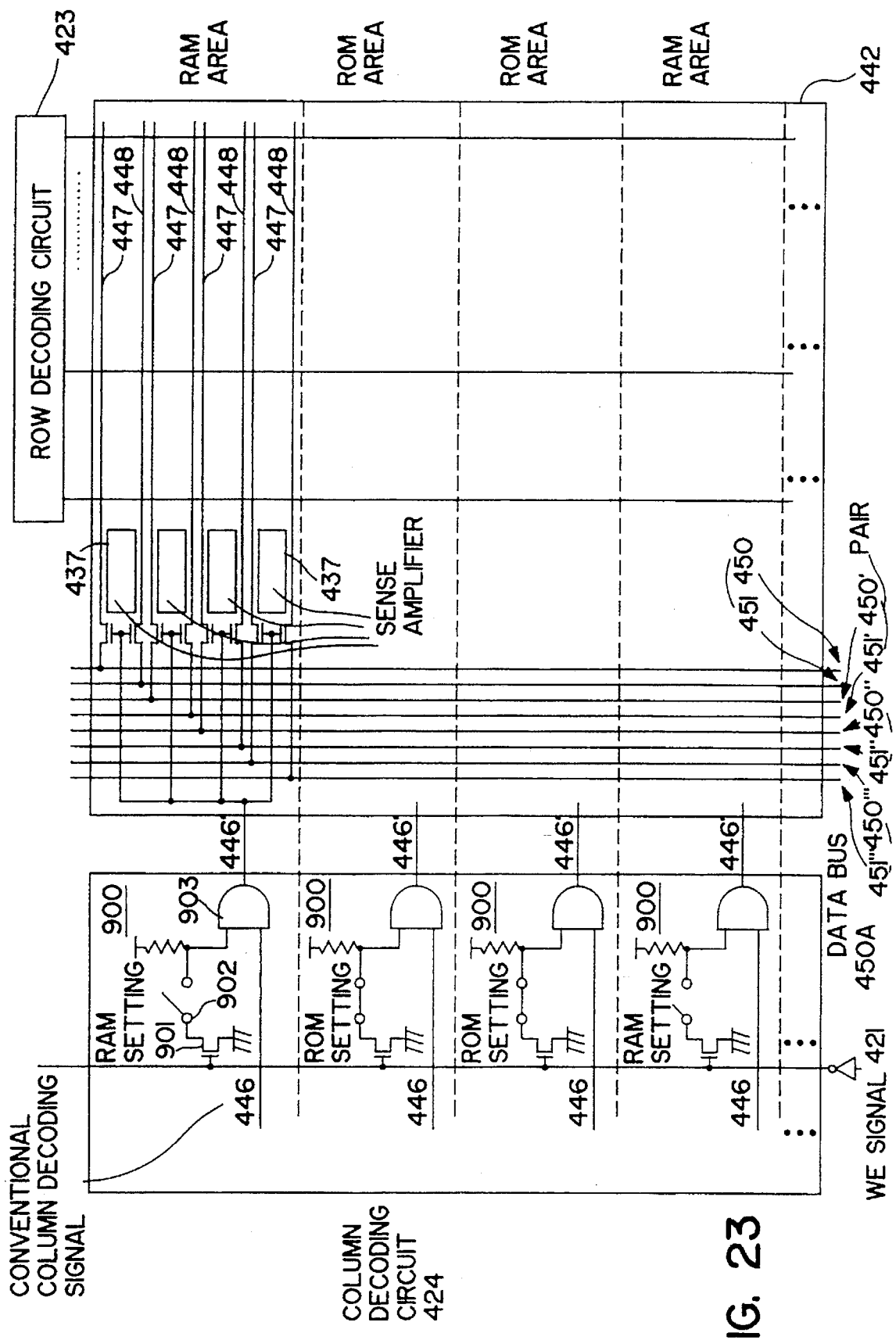
FIG. 23 is a schematic view showing the main portion of the semiconductor memory device of a thirteenth example according to the present invention.
Figure 24A:
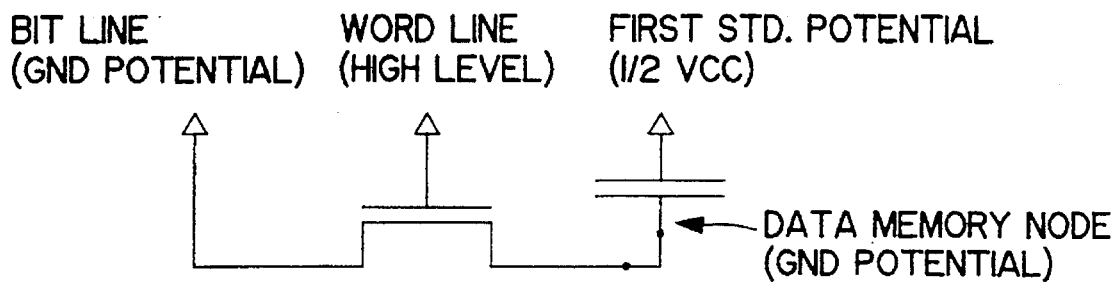
FIGS. 24a, 24b, and 24c are circuit diagrams of a first memory cell, a second memory cell, and a dummy cell, respectively, showing the potentials in the initialization process of the semiconductor memory device according to the present invention.
Figure 24B:
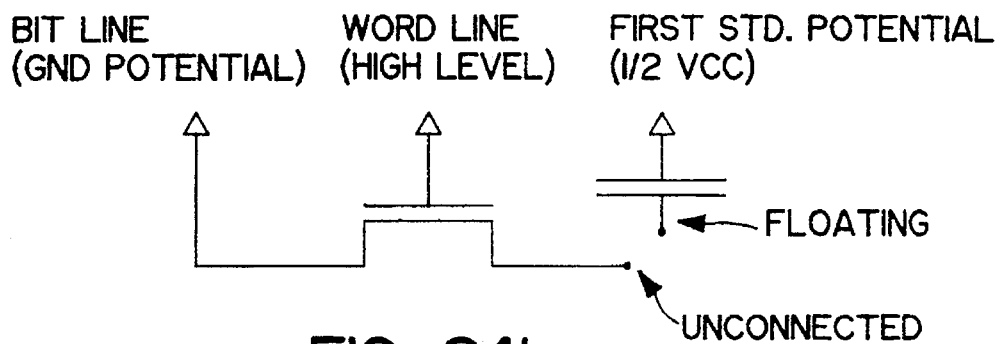
Figure 24C:
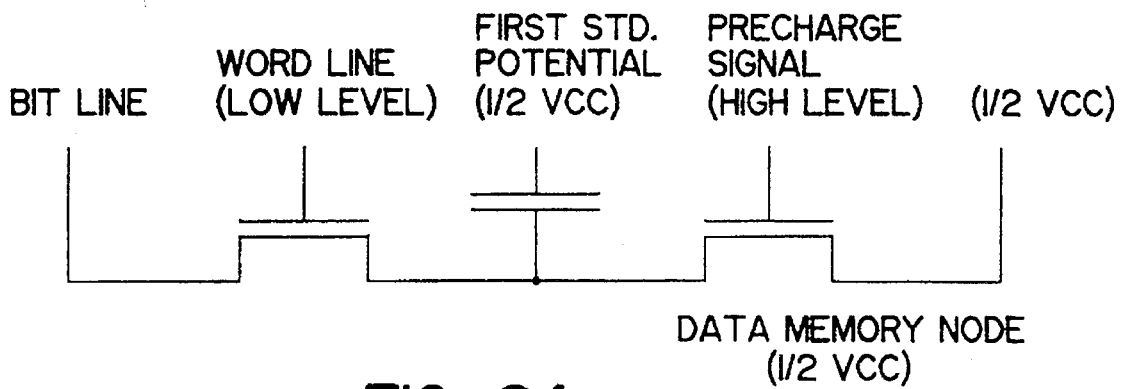

FIG. 23 shows the semiconductor memory device of this example according to the present invention. In this example, ROM areas and RAM areas can be defined by each column address composed of four pairs of bit lines 447 and 448 on the memory block.

In this example, for the column address designated as the ROM area, data is sent up to a four-bit data bus 450A composed of four pairs of I/O lines 450 and 451. This is because the write protect signal sent to one of the input terminals of the write circuit 449 is fixed to the LOW level. However, in this example, the WE signal 421 is inverted and then input to the column decoding circuit 424.

To ensure the write protect for the ROM areas, the semiconductor memory device of this example is provided with a write protect detection element 900 for each column address. The write protect detection element 900 which includes an NMOS transistor 901, a switching element 902, and an AND gate 903 is operated as follows.

When a particular column address is desired to be a RAM area, the switching element 902 of the write protect detection element 900 corresponding to the particular column address is set to the OFF state (high impedance state) previously in the fabricating process of the semiconductor memory device. Under this state, one of the input terminals of the AND gate 903 connected to the switching element 902 receives a HIGH-level signal at any time. Thus, when the column address selective signal 446 input to the other input terminal of the AND gate 903 is in the HIGH level, the AND gate 903, i.e., the write protect detection element 900 outputs the HIGH-level column decoding signal 446 at any time. This results in that the bit lines 447 and 448 are connected to the data bus 450A, thus to allow data to be written on the memory cells connected to these particular bit lines 447 and 448.

On the other hand, when a particular column address is desired to be a ROM area, the switching element 902 of the write protect detection element 900 corresponding to the particular column address is set to the ON state (low impedance state) previously in the fabricating process of the semiconductor memory device. Under this state, when the WE signal 421 input to the column decoding circuit 424 is in the HIGH level, one of the input terminals of the AND gate 903 receives a HIGH-level signal. As a result, even when the column address selective signal 446 input to the other input terminal of the AND gate 903 is in the HIGH level, the write protect detection element 900 outputs the LOW-level column decoding signal 446'. This results in that when the WE signal 421 is in the HIGH level, the bit lines 447 and 448 are not connected to the data bus 450A. Thus, data carried on the data bus 450A is prevented from being sent to the bit lines 447 and 448. In this way, data written on the memory cells connected to the particular pairs of bit lines 447 and 448 are protected.

The switching element 902 can be easily set to the ON or OFF state in the fabricating process of the semiconductor memory device by forming an interconnection, a contact, or the like or not, and this setting can be programmed by patterning a mask for the interconnection or the contact.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device having a plurality of bit lines and a plurality of word lines, said device comprising:

at least one first memory cell including a first capacitor having a first terminal as a data memory node and a second terminal provided with a first standard potential, and a first switching transistor having a gate connected to one of said word lines, a source, and a drain, one of said source and said drain being connected to one of said bit lines and the other being connected to said first terminal of said first capacitor; and at least one second memory cell including a second capacitor having a first terminal, kept in a floating condition in which no substantial electrical connection is established with each of said bit lines, and a second terminal provided with the first standard potential.

2. A semiconductor memory device according to claim 1, wherein said second memory cell further includes a second switching transistor having a gate connected to a specific word line among said plurality of word lines, said second switching transistor being in the OFF state at any time regardless of said specific word line connected to said gate of said second switching transistor being selected or not.

3. A semiconductor memory device according to claim 2, wherein either of a source and a drain of said second switching transistor is not electrically connected to said first terminal of said second capacitor.

4. A semiconductor memory device according to claim 3, wherein one of said source and said drain of said second switching transistor is connected to one of said plurality of bit lines.

5. A semiconductor memory device according to claim 1, further comprising:
- a precharge means for precharging each of said plurality of bit lines to a second standard potential independent from said first standard potential; and
- an initializing means for initializing said data memory node of said first capacitor to a third standard potential difference from said second standard potential; and
- wherein in a read operation after the initialization by said initializing means, the potential of a specific one of said bit lines changes when said first memory cell corresponding to said specific bit line is selected in accordance with a selection of said word lines, and the potential of said specific bit line is kept unchanged when said second memory cell corresponding to said specific bit line is selected in accordance with said selection of said word lines.

6. A semiconductor memory device according to claim 1, further comprising a bit line potential change means for changing the potential of each of said bit lines to which said first memory cell is connected by approximately a half of the potential change of each of said bit lines caused by said first memory cell.

7. A semiconductor memory device according to clam 1, further comprising a protect means for protecting an area having both said first memory cell and said second memory cell mixed thereon from writing data into said first and second memory cells in said area.

8. A semiconductor memory device according to claim 1, wherein said device includes a plurality of said first memory cells, a plurality of said second memory cells, a first area having both said first memory cell and said second memory cell mixed thereon and a second area having only said first memory cell, said second area being write permitted, and
- the device further comprises a protect means for protecting said first area from writing data into said first and second memory cells of said first memory area.

9. A semiconductor memory device according to claim 8, wherein said first area is a ROM area and said second area is a RAM area.

10. A semiconductor memory device according to claim 9, wherein said device includes a plurality of areas, and each area can be said ROM area or said RAM area.

11. A semiconductor memory device according to claim 1, wherein said second terminal of said first capacitor and said second terminal of said second capacitor share a common cell plate having the first standard potential.

12. A semiconductor memory device having a plurality of bit lines and a plurality of word lines, said device comprising:
- at least one first memory cell including a first capacitor having a first terminal as a data memory node and a second terminal with a first standard potential, and a first switching transistor having a gate connected to one of said word lines, a source, and a drain, one of said source and said drain being connected to one of said bit lines and the other being connected to said first terminal of said first capacitor;
- at least one second memory cell including a second switching transistor having a gate connected to a specific word line among said plurality of word lines; and
- a protect means for protecting an area having both said first memory cell and said second memory cell mixed thereon from writing data into said first and second memory cells in said area.

13. A semiconductor memory device according to claim 12, further comprising:
- a precharge means for precharging each of said plurality of bit lines to a second standard potential independent from said first standard potential; and
- an initializing means for initializing said data memory node of said first capacitor to a third standard potential different from said second standard potential,
- wherein in a read operation after the initialization by said initializing means, the potential of a specific one of said plurality of bit lines changes when said first memory cell corresponding to said specific bit line is selected in accordance with a selection of said word lines, and the potential of said specific bit line is kept unchanged when said second memory cell corresponding to said specific bit line is selected in accordance with said selection of said word lines.

14. A semiconductor memory device according to claim 12, further comprising a bit line potential change means for changing the potential of each of said bit lines to which said first memory cell is connected by approximately a half of the potential change of each of said bit lines caused by said first memory cell.

15. A semiconductor memory device according to claim 12, wherein said device includes a plurality of said first memory cells, a plurality of said second memory cells, a first area having both said first memory cell and said second memory cell mixed thereon and a second area having only said first memory cell, said second area being write permitted, and
- the device further comprises a protect means for protecting said first area from writing data into said first and second memory cells of said first memory area.

16. A semiconductor memory device according to claim 15, wherein said first area is a ROM area and said second area is a RAM area.

17. A semiconductor memory device according to claim 16, wherein said device includes a plurality of areas, and each area can be said ROM area or said RAM area.

18. A semiconductor memory device according to claim 12, wherein said device further includes a second capacitor having a first terminal as a data memory node and a second terminal provided with a first standard potential, and one of a source and drain of said second switching transistor is connected to a specific bit line among said plurality of bit lines and the other is connected to said first terminal of said second capacitor, said second capacitor having a sufficiently small capacitance so as to cause no substantial change in a potential of each of said bit lines.

19. A semiconductor memory device according to claim 18, wherein said second capacitor has substantially zero capacitance.

20. A semiconductor memory device having a plurality of bit lines and a plurality of word lines, said device comprising:

at least one first memory cell including a first capacitor having a first terminal as a data memory node and a second terminal with a first standard potential, and a first switching transistor having a gate connected to one of said word lines, a source, and a drain, one of said source and said drain being connected to one of said bit lines and the other being connected to said first terminal of said first capacitor; and at least one second memory cell including a second switching transistor having a gate connected to a specific word line among said plurality of word lines, wherein said device includes a plurality of said first memory cells, a plurality of said second memory cells, a first area having both said first memory cell and said second memory cell mixed thereon and a second area having only said first memory cell, said second area being write permitted, and the device further comprises a protect means for protecting said first area from writing data into said first and second memory cells in said first memory area.

21. A semiconductor memory device according to claim 20, wherein said first area is a ROM area and said second area is a RAM area.

22. A semiconductor memory device according to claim 21, wherein said device includes a plurality of areas, and wherein each one of said areas can be a ROM area or a RAM area.

* * * * *